US012628417B2

(12) United States Patent
Li et al.

(10) Patent No.: US 12,628,417 B2
(45) Date of Patent: May 12, 2026

(54) THREE-DIMENSIONAL (3D) FIELD EFFECT TRANSISTORS (FETS) WITH GATE CUTS TO ENHANCE CARRIER MOBILITY AND RELATED FABRICATION METHODS

(71) Applicant: QUALCOMM Incorporated, San Diego, CA (US)

(72) Inventors: Xia Li, San Diego, CA (US); Ming-Huei Lin, New Taipei (TW); Haining Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 376 days.

(21) Appl. No.: 18/336,269

(22) Filed: Jun. 16, 2023

(65) Prior Publication Data

US 2024/0421157 A1     Dec. 19, 2024

(51) Int. Cl.
| | |
|---|---|
| *H01L 27/092* | (2006.01) |
| *H01L 21/8238* | (2006.01) |
| *H10D 84/01* | (2025.01) |
| *H10D 84/03* | (2025.01) |
| *H10D 84/85* | (2025.01) |

(52) U.S. Cl.
CPC ....... *H10D 84/853* (2025.01); *H10D 84/0172* (2025.01); *H10D 84/038* (2025.01); *H10D 84/85* (2025.01)

(58) Field of Classification Search
CPC .. H10D 30/024; H10D 30/62; H10D 30/6211; H10D 30/6212; H10D 30/6213; H10D 84/0153; H10D 84/0158; H10D 84/0172; H10D 84/0193; H10D 84/038; H10D 84/834; H10D 84/85; H10D 84/853
See application file for complete search history.

(56) References Cited

U.S. PATENT DOCUMENTS

| | | |
|---|---|---|
| 2019/0148539 A1 | 5/2019 | Yang et al. |
| 2023/0068140 A1 | 3/2023 | Fung |
| 2023/0070925 A1 | 3/2023 | Min et al. |
| 2023/0139399 A1* | 5/2023 | Zhou .................... H10D 62/118 |
| | | 257/506 |
| 2024/0145249 A1* | 5/2024 | Chen .................. H10D 84/0172 |

OTHER PUBLICATIONS

International Search Report and Written Opinion for International Patent Application No. PCT/US2024/032205, mailed Sep. 23, 2024, 18 pages.
Chan, V. et al., "Strain for CMOS performance Improvement," IEEE 2005 Custom Integrated Circuits Conference, Sep. 2005, IEEE, San Jose, CA, USA, pp. 667-674.
Pesic-Brdanin, T. et al., "Strained Silicon Layer in CMOS Technology," Electronics, vol. 18, No. 2, Dec. 2014, pp. 63-69.

* cited by examiner

*Primary Examiner* — David C Spalla
(74) *Attorney, Agent, or Firm* — Withrow & Terranova, PLLC

(57) ABSTRACT

A gate cut extending through a gate adjacent to a channel region of a 3D FET causes the gate to exert a first force and a second force in directions orthogonal to each other on the channel region. The gate cut may include a gate cut wall to cause the gate to exert a first force in a first direction on the channel region. The gate cut may include a gate cut wedge to cause the gate to exert a second force in the first direction and exert a third force in a second direction on the channel region. The 3D FET may be P-type or N-type and the 3D FET may be FinFET or GAA FET.

30 Claims, 13 Drawing Sheets

3D FINFET
STRUCTURE 100

3D GAA FET
STRUCTURE 200

CMOS GAA FET
STRUCTURE 500

FINFET
STRUCTURE 900

GATE
914

904

P1  916

MASK
918

902

910
912

908

Z

SUBSTRATE
906

920

X        Y

FORMING A SLICE 432 THROUGH
THE GATE 412 AND THE
INSULATING LAYER 408 TO THE
SUBSTRATE 404 ADJACENT TO
THE CHANNEL REGION 414N,
414P OF THE SEMICONDUCTOR
SLAB
402N,402P

TO FIG. 11B

GAA FET
STRUCTURE 1000

1012
1010

GATE
1014

P1  1016

MASK
1018

1004

1002

1008

Z

SUBSTRATE
1006

X        Y

FINFET
STRUCTURE 900

SLICE 916

914

908

Z

Y

X

VOID
922

GAA FET
STRUCTURE 1000

SLICE 1016

1014

1008

Z

Y

X

VOID 1022

FROM FIG. 11A

FORMING A VOID 436 IN THE
INSULATING LAYER 408 WIDER IN
THE SECOND DIRECTION THAN
THE SLICE 432

TO FIG. 11C

FINFET
STRUCTURE 900

916

915

924
922
920

926

Z

X   Y

FROM FIG. 11B

FORMING A GATE CUT WEDGE
430N,430P COMPRISING A FIRST
GATE CUT MATERIAL 434C,434T
IN THE VOID 436

TO FIG. 11D

GAA FET
STRUCTURE 1000

1016

1015

1024
1022
1020

1026

Z

X   Y

FINFET
STRUCTURE 900
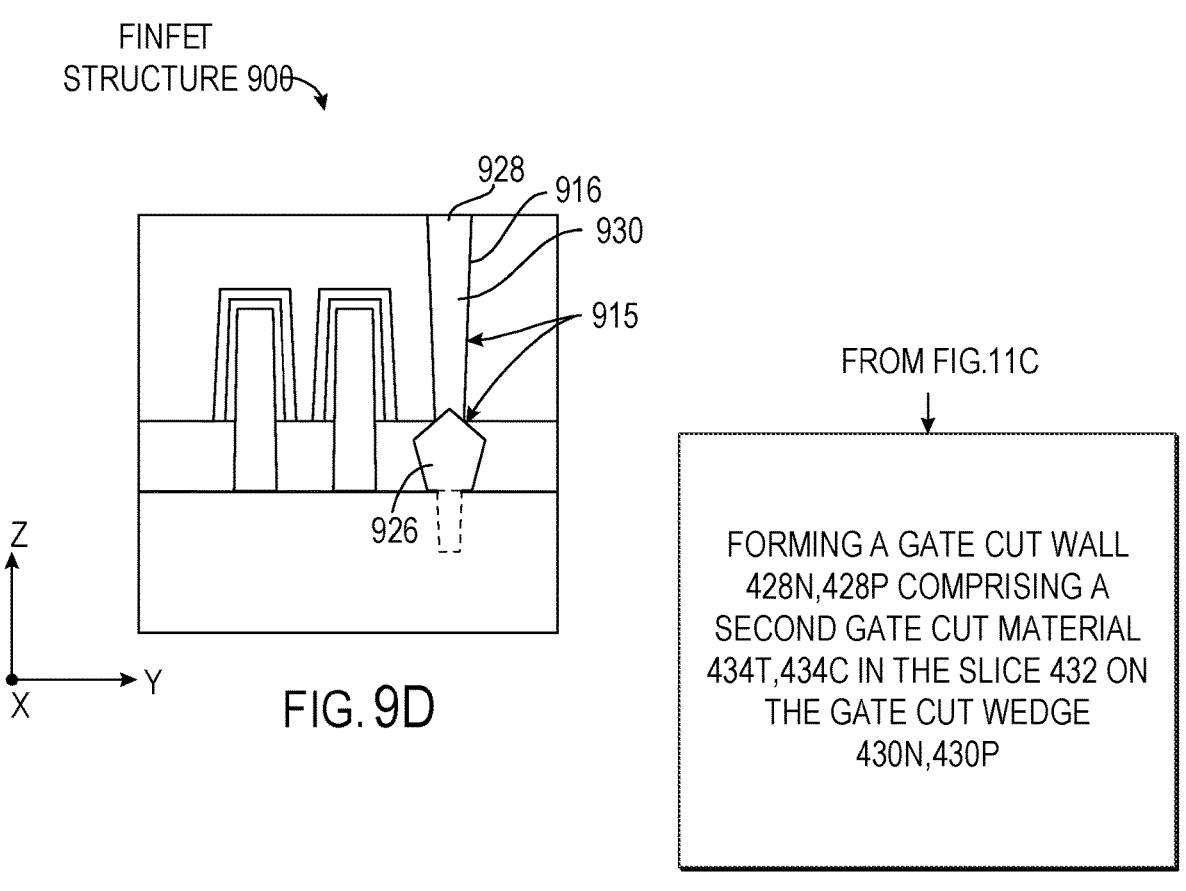
FIG. 9D
FROM FIG.11C
FORMING A GATE CUT WALL
428N,428P COMPRISING A
SECOND GATE CUT MATERIAL
434T,434C IN THE SLICE 432 ON
THE GATE CUT WEDGE
430N,430P
FIG. 11D
GAA FET
STRUCTURE 1000
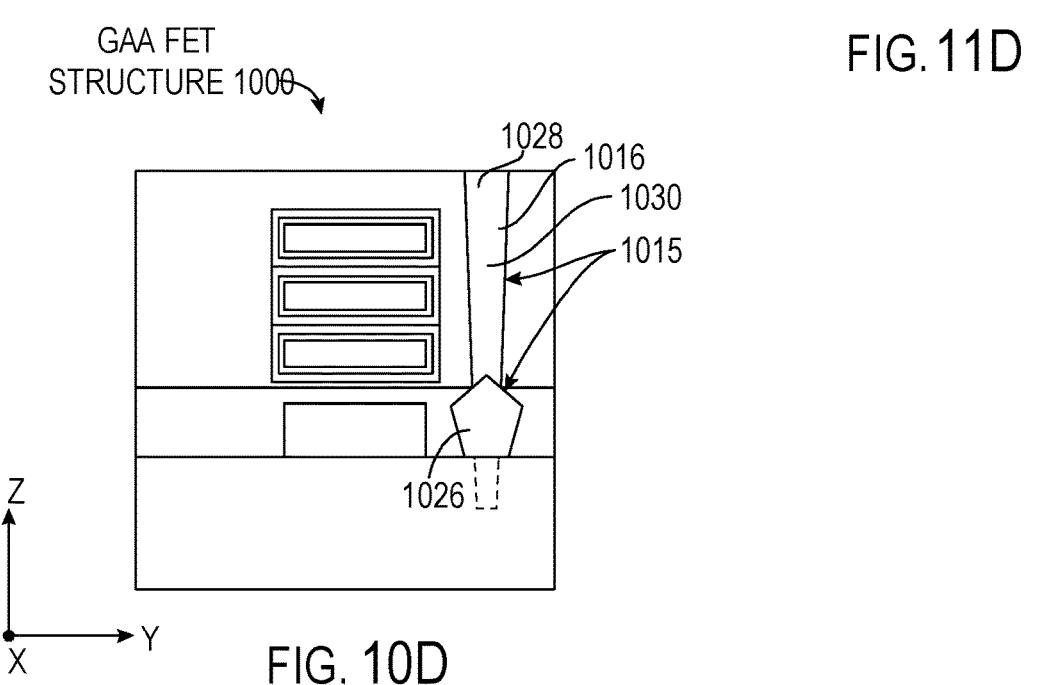
FIG. 10D

THREE-DIMENSIONAL (3D) FIELD EFFECT TRANSISTORS (FETS) WITH GATE CUTS TO ENHANCE CARRIER MOBILITY AND RELATED FABRICATION METHODS

BACKGROUND

I. Field of the Disclosure

The technology of the disclosure relates generally to transistors in integrated circuits and, more particularly, to three-dimensional transistors.

II. Background

Current flow in channel regions of field-effect transistors (FETs) is controlled by a gate voltage applied to a gate adjacent to the channel region. Where the gate is adjacent to a surface of the channel region, the gate voltage has the effect of opening or shutting a thin conductive channel layer for the flow of majority carriers (i.e., electrons and holes) below the surface. In planar FETs, the conductive channel is formed in one surface of a semiconductor substrate. To increase a total cross-sectional area of the channel region to increase drive strength, fin-type FETs (FinFETs) and gate-all-around (GAA) FETs have been developed. In both Fin-FETs and GAA FETs, the channel region is induced in multiple faces of a slab of doped semiconductor material. The slab includes two planar faces and two edges between the major faces. The direction current flow is orthogonal to a cross-section of the slab. Being able to apply the gate voltage to both planar surfaces makes it possible to open or shut current channels on both sides of the slab, essentially doubling the drive strength relative to a planar FET. In addition, FinFETs and GAA FETs, which are both three-dimensional (3D) FETs, may include multiple slabs to further increase drive strength. It has been found that applying a force (e.g., stress and strain) to the crystalline structure of the semiconductor slab in the channel region of a FET can improve carrier mobility. However, it can be difficult to apply such stresses to the slabs of 3D FETs.

SUMMARY

Aspects disclosed in the detailed description include three-dimensional (3D) field-effect transistors (FETs) with gate cuts to enhance carrier mobility. Related methods of fabricating 3D FETs that include gate cuts to enhance carrier mobility are also disclosed. Although the semiconductor slabs (e.g., fins) in fin-type FETs (FinFETs) and the semiconductor slabs (e.g., nanosheets) in gate-all-around (GAA) FETs are oriented along different planes of a crystal structure of a semiconductor wafer, forces applied in the channel regions in the same directions relative to the surfaces of such semiconductor slabs can improve carrier mobility in both types of 3D FETs. In an exemplary 3D FET disclosed herein, a gate cut is provided in a gate adjacent to the channel region to cause a first force in a first direction and a second force in a second direction, orthogonal to the first direction, to be exerted on the channel regions of the semiconductors slabs to improve carrier mobility, thereby increasing drive strength of the 3D FET. The first force and the second force complement each other to enhance the carrier mobility for greater drive strength than can be achieved by either force individually. For example, the gate cut may include a gate cut wall of a first gate cut material to cause the gate to exert the first force on the channel region of the semiconductor slabs in the first direction. In a further example, the gate cut may also include a gate cut wedge to also cause the gate to exert the first force in the first direction and cause the gate to exert the second force in the second direction on the channel region of the semiconductor slabs to further improve carrier mobility. In some examples, the 3D FET may be a P-type FET or an N-type FET, and the 3D FET may be either a FinFET or a GAA FET. In some examples, a 3D complementary metal oxide semiconductor (CMOS) FET may include an NFET and a PFET that each includes a gate cut to improve drive strength.

In this regard, in one aspect, a 3D FET structure is disclosed. The 3D FET structure includes at least one semiconductor slab, each comprising a channel region configured to conduct a current in a first direction. The 3D FET structure further includes a gate extending in a second direction orthogonal to the first direction, the gate comprising a gate material disposed on the at least one semiconductor slab in the channel region, and a gate cut extending through the gate material adjacent to the channel region of the at least one semiconductor slab in the second direction, wherein the gate cut is configured to cause the gate to exert a first force in the second direction and a second force in a third direction orthogonal to the second direction on the channel region of the at least one semiconductor slab.

In another aspect, a method of fabricating a 3D FET structure is disclosed. The method includes forming at least one semiconductor slab, each comprising a channel region configured to conduct a current in a first direction. The method further includes forming a gate extending in a second direction orthogonal to the first direction, the gate comprising a gate material disposed on the at least one semiconductor slab in the channel region. The method also includes forming a gate cut extending through the gate material adjacent to the channel region of the at least one semiconductor slab in the second direction, wherein the gate cut is configured to cause the gate to exert a first force in the second direction and a second force in a third direction orthogonal to the second direction on the channel region of the at least one semiconductor slab.

In another aspect, a complementary metal-oxide semiconductor (CMOS) circuit structure is disclosed. The CMOS circuit structure includes at least one first semiconductor slab, each comprising a first type dopant, a first channel region configured to conduct a first current in a first direction, a first source/drain region on a first side of the first channel region, and a second source/drain region on a second side of the first channel region. The CMOS circuit structure further includes a first gate extending in a second direction orthogonal to the first direction, the first gate comprising a gate material disposed on each of the at least one first semiconductor slab in the first channel region. The CMOS circuit structure also includes a first gate cut extending through the first gate adjacent to the first channel region of the at least one first semiconductor slab in the second direction. The CMOS circuit structure further includes at least one second semiconductor slab, each comprising a second type dopant, a second channel region configured to conduct a second current in the first direction, a third source/drain region on a first side of the second channel region, and a fourth source/drain region on a second side of the second channel region. The CMOS circuit structure also includes a second gate extending in the second direction and comprising the gate material disposed on each of the at least one second semiconductor slab in the second channel region and a second gate cut extending through the second gate adjacent to the second channel region of the at least one second semiconductor slab in the second direction, wherein the first gate cut is configured to cause the first gate to exert a first force in the second direction and a second force in a third direction orthogonal to the second direction on the first channel region of the at least one first semiconductor slab, and the second gate cut is configured to cause the second gate to exert a third force in the second direction and a fourth force in the third direction on the second channel region of the at least one second semiconductor slab.

BRIEF DESCRIPTION OF THE DRAWINGS

FIGS. 9A-9D and 10A-10D are exemplary fabrication stages during fabrication of 3D FETs (FinFETs and GAA FETs, respectively), including gate cuts in the gates adjacent to the semiconductor slabs (e.g., fin and nanosheets) to cause the gate to exert forces in two directions on the channel regions to improve carrier mobility, and according to the exemplary fabrication process in FIGS. 11A-11D;

FIGS. 11A-11D is a flowchart illustrating another exemplary fabrication process of fabricating 3D FETs, including gate cuts to improve carrier mobility, including but not limited to the 3D FETs in FIGS. 3-7, as illustrated in FIGS. 9A-10D;

components that can include 3D FETs, including gate cuts in the gates formed adjacent to the semiconductor slabs (e.g., nanosheets) to cause the gate to exert forces on the channel regions in two directions to improve carrier mobility and increase drive strength, including but not limited to the 3D FETs in FIGS. 3-7 and according to, but not limited to, any of the exemplary fabrication processes of fabricating such 3D FETs in FIGS. 8 and 11A-11D.

DETAILED DESCRIPTION

Figure 1:
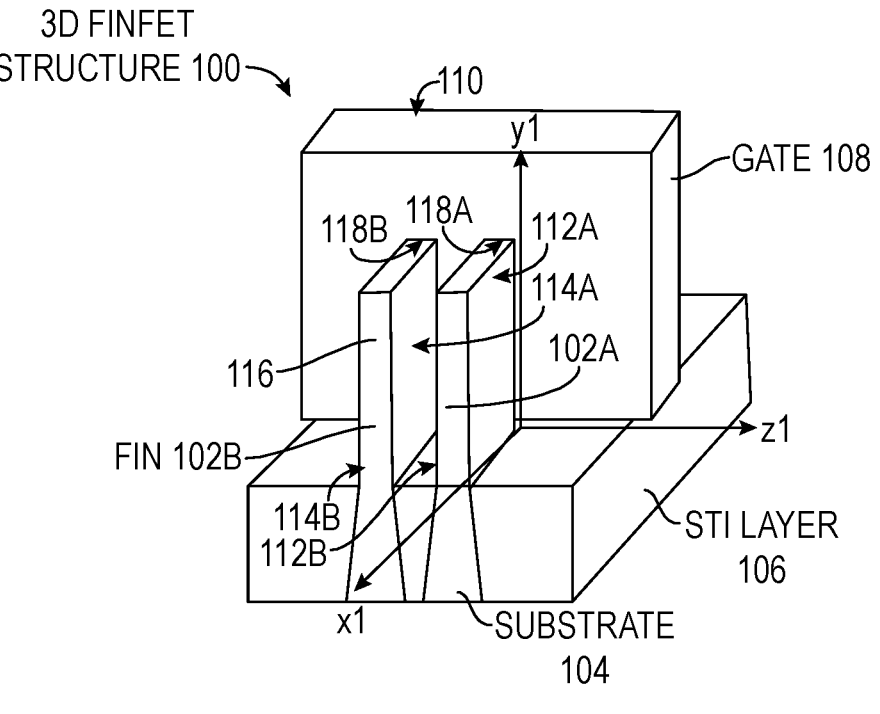
FIG. 1 is an illustration of a three-dimensional (3D) fin-type field-effect transistor (FET) (FinFET) structure and axes indicating directions of forces relative to surfaces of semiconductor slabs (fins) to improve carrier mobility.

Several exemplary aspects of the present disclosure are described in reference to the drawing figures. The word "exemplary" is used herein to mean "serving as an example, instance, or illustration." Any aspect described herein as "exemplary" is not necessarily to be construed as preferred or advantageous over other aspects.

Aspects disclosed in the detailed description include three-dimensional (3D) field-effect transistors (FETs) with gate cuts to enhance carrier mobility. Related methods of fabricating 3D FETs that include gate cuts to enhance carrier mobility are also disclosed. Although the semiconductor slabs (e.g., fins) in fin-type FETs (FinFETs) and the semiconductor slabs (e.g., nanosheets) in gate-all-around (GAA) FETs are oriented along different planes of a crystal structure of a semiconductor wafer, forces applied in the channel regions in the same directions relative to the surfaces of such slabs can improve carrier mobility in both types of 3D FETs. In an exemplary 3D FET disclosed herein, a gate cut provided in a gate adjacent to the channel region includes a gate cut wall and a gate cut wedge to cause a first force in a first direction and a second force in a second direction, orthogonal to the first direction, to be exerted on the channel regions of the semiconductors slabs to improve carrier mobility, thereby increasing drive strength of the 3D FET. The first force and the second force are applied orthogonal to each other and complement each other to enhance the carrier mobility for greater drive strength than can be achieved by either force individually. For example, the gate cut may include a gate cut wall of a first gate cut material to cause the gate to exert a first force on the channel region of the semiconductor slabs in the first direction. In a further example, the gate cut may also include a gate cut wedge to cause the gate to exert the first force in the first direction and cause the gate to exert the second force in the second direction on the channel region of the semiconductor slabs to further improve carrier mobility. In some examples, the 3D FET may be a P-type FET or an N-type FET, and the 3D FET may be either a FinFET or a GAA FET. In some examples, a 3D complementary metal oxide semiconductor (CMOS) FET may include an NFET and a PFET that each includes a gate cut to improve drive strength.

Before discussing examples of 3D FETs that include a gate cut to exert forces on the gate to cause the gate to exert complementary forces on the channel regions in two (2) different directions orthogonal to each other, starting at FIG. 3, examples of 3D FETs that do not include gate cuts formed in a gate adjacent to the semiconductor slabs are discussed first below with regard to FIGS. 1 and 2.

In this regard, FIG. 1 is an illustration of a three-dimensional (3D) fin-type field-effect transistor (FET) (FinFET) structure 100, including semiconductor slabs or fins 102A and 102B (referred to collectively as "fins 102") formed from a semiconductor wafer or substrate 104. The 3D FET structure 100 also includes an insulation layer or shallow trench isolation (STI) layer 106 and a gate 108 formed over the fins 102. The gate 108 is formed of a gate material 110 (e.g., polysilicon) that is disposed on first faces 112A, 114A and second faces 112B, 114B of the fins 102. FIG. 1 includes spatial X. Y, and Z axes similar to those of a Cartesian coordinate system to identify spatial orientation. In the examples in Figures herein, including FIG. 1, a plane including the X axis and the Y axis is parallel to a substrate. FIG. 1 also includes axes x1, y1, and z1, indicating directions that are longitudinal, lateral, and orthogonal, respectively, relative to the first faces 112A, 114A and the second faces 112B, 114B of the fins 102. As shown here, because the face 112A is orthogonal to the substrate 104, the spatial Y and Z axes are opposite to the y1 and z1 axes.

The fins 102 (e.g., semiconductor slabs 102) are formed in a subtractive process from the semiconductor substrate 104, which has a crystalline structure 116. In some examples, the semiconductor substrate 104 is a slice or wafer of a silicon crystal grown with a predetermined crystal orientation. In this regard, faces 112A, 114A, 112B, and 114B of the fins 102, which are planar, correspond to planes in the crystalline structure 116 having Miller indices (110). The direction of current through the fins 102, which is in the direction of the x1-axis, or longitudinal direction, has a Miller index of <110>. The gate 108 extends over channel regions 118A, 118B of the fins 102 in the z1-axis direction, which is orthogonal to the faces 112A, 114A, 112B and 114B of the fins 102. The y1-axis direction, or lateral direction, extends across the channel regions 118A, 118B orthogonal to the current direction.

Figure 2:
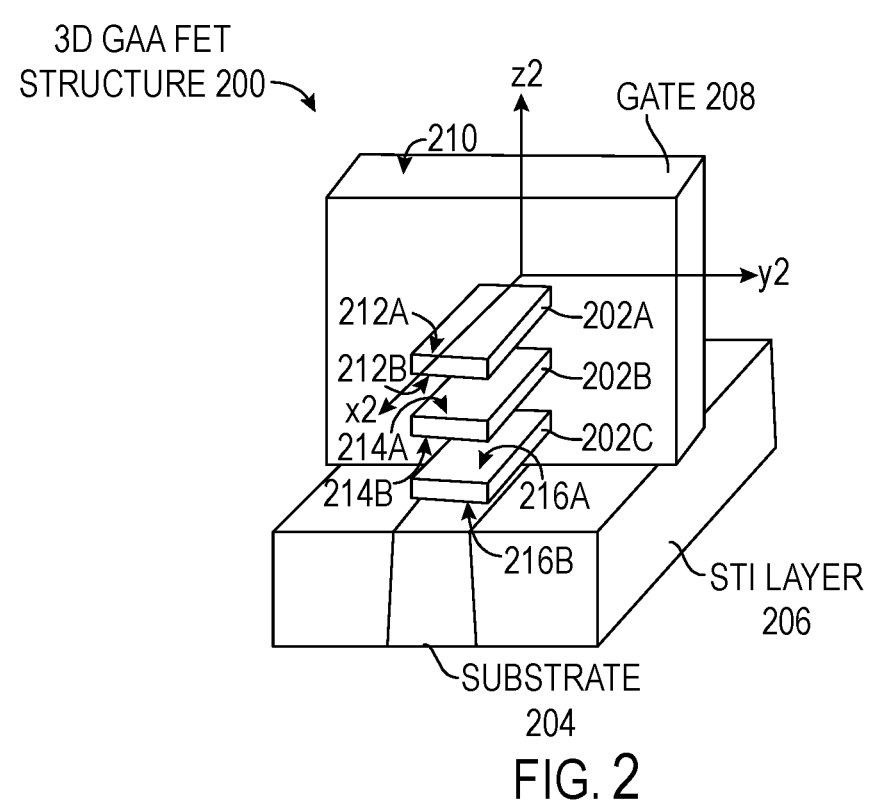
FIG. 2 is an illustration of a 3D gate-all-around (GAA) FET structure and axes indicating directions of forces relative to surfaces of semiconductor slabs (nanosheets) to improve carrier mobility.

FIG. 2 is an illustration of another 3D FET structure 200, which is a gate-all-around (GAA) FET including semiconductor slabs or nanosheets 202A-202C (referred to collectively as "nanosheets 202") that are also formed from a semiconductor wafer or substrate 204 and have a same crystalline structure as the crystalline structure 116 in FIG. 1. The 3D FET structure 200 also includes an STI layer 206 and a gate 208 formed over the nanosheets 202. The gate 208 is formed of a gate material 210 that is disposed on first faces 212A, 214A, 216A, and second faces 212B, 214B, 216B of the nanosheets 202. FIG. 2 includes spatial axes X, Y, and Z, and also includes axes x2, y2, and z2 indicating longitudinal, lateral, and orthogonal directions, respectively, relative to each of the faces 212A-216A and 212B-216B. Here, because the face 212A is parallel to the substrate 204, the Y and Z axes are the same as the y2 and z2 axes, respectively. In remaining Figures herein, only the spatial axes X. Y, and Z are shown in each example. The orientation of stresses relative to the faces of semiconductor slabs in the remaining examples can be determined with reference back to FIGS. 1 and 2.

The nanosheets 202 are formed in a subtractive process from the semiconductor substrate 204. The direction of current flow through the nanosheets 202 is in the x2-axis direction, or longitudinal direction, having a Miller index of <100>, which corresponds to the x1-axis direction in the fins 102 in FIG. 1. However, the first faces 212A-216A and second faces 212B-216B correspond to planes having Miller indices of (100). As a reminder, the faces 112A, 114A, 112B, and 114B of the fins 102 have Miller indices (110). Thus, the z2-axis in FIG. 2, which is orthogonal to the first faces 212A-216A and second faces 212B-216B, corresponds to the y1-axis in FIG. 1, and the y2-axis, which extends across channel regions 218, corresponds to the z1-axis in FIG. 1.

It has been determined that applying forces to the crystalline structures of semiconductor slabs in the channel regions can improve carrier mobility through the channel regions if provided in certain directions. In addition, such improvement applies to both N-type metal oxide semiconductor (MOS) and P-type MOS devices, where N-type and P-type refer to whether the semiconductor material has electrons or holes as majority carriers due to being doped with a trivalent-type dopant or a pentavalent-type dopant, respectively. Although a P-type semiconductor slab may benefit from a compressive force in one direction, while an N-type semiconductor slab benefits from a tensile force in such direction, and vice versa.

Even though the first faces 112A, 112B and the second faces 114A and 114B of the fins 102 in FIG. 1 have a different crystal orientation than the faces 212A-216A and 212B-216B of the nanosheets 202 in FIG. 2, forces having the same directions relative the faces of the fins 102 and the nanosheets 202 have been found to improve carrier mobility, which increases device performance. As shown in Table A below, for example, tensile forces in the lateral direction (in the y1 direction, which is orthogonal to current flow direction) across the first faces 112A and 112B improve carrier mobility in the fins 102 in both P-type and N-type silicon, and tensile forces in the lateral direction (in the y2 direction) across the faces 212A-216A also improve carrier mobility in the nanosheets 202 (both P-type and N-type). Table A also shows that there are differences between NMOS and PMOS regarding the types (i.e., whether compressive or tensile) of orthogonal forces in the z1/z2 directions.

TABLE A

|  | Axes | NMOS | PMOS |
| --- | --- | --- | --- |
| Longitudinal | x1/x2 | Tensile | Compressive |
| Lateral | y1/y2 | Tensile | Tensile |
| Orthogonal | z1/z2 | Compressive | Tensile |

Figure 3:
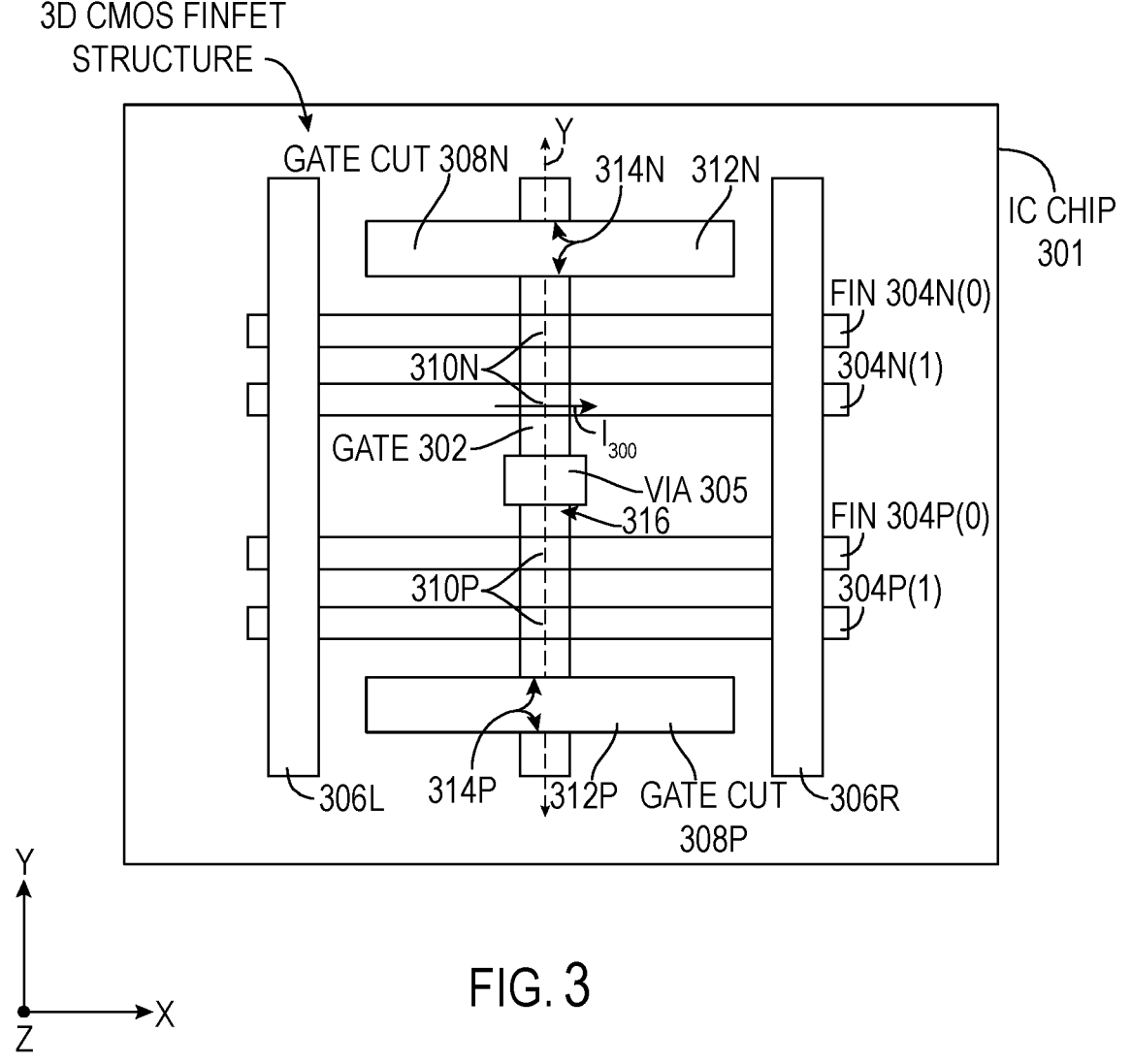
FIG. 3 is a top view of a 3D complementary metal oxide semiconductor (MOS) (CMOS) FinFET circuit structure, including an N-type MOS (NMOS) FinFET and a P-type MOS (PMOS) FinFET that each includes exemplary gate cuts formed in gates adjacent to the semiconductor slabs (e.g., fins) to exert forces on the gate to cause the gate to exert forces on the channel regions in two (2) different directions.

FIG. 3 is a top view of a 3D complementary MOS (CMOS) FinFET structure 300 (FinFET structure 300), including an N-type MOS (NMOS) FinFET (NFET), and a P-type MOS (PMOS) FinFET (PFET). The FinFET structure 300 is disposed on an integrated circuit (IC) chip 301 and includes a gate 302 and fins 304P(0)-304P(1) and 304N(0)-304N(1). In operation, current $I_{300}$ flows in a first, horizontal direction (X-axis direction) longitudinally through the fins (e.g., semiconductor slabs) 304P(0)-304P(1) and 304N(0)-304N(1). The gate 302 extends across the fins 304P(0)-304P(1) and 304N(0)-304N(1) in a second, horizontal direction (Y-axis direction). The gate 302 may be coupled in a third, vertical direction (Z-axis direction) to a metal interconnect layer (not shown) by a via 305. Dummy gates 306L and 306R extending across the fins 304P(0)-304P(1) and 304N(0)-304N(1) are electrically inactive.

The CMOS FinFET structure 300 includes exemplary gate cut 308P adjacent to the fins 304P(0)-304P(1) (also referred to as semiconductor slabs 304P(0)-304P(1)) and gate cut 308N adjacent to the fins 304N(0)-304N(1). As shown in a cross-sectional view in FIG. 4, the gate cuts 308P and 308N are formed in the gate 302 to include a gate cut wall and a gate cut wedge (see FIG. 4) that exert forces on the gate 302 to cause the gate 302 to exert forces on channel regions 310P and 310N in a first direction and a second direction orthogonal to the first direction to improve carrier mobility in the fins 304P(0)-304P(1) and 304N(0)-304N(1). The gate cut 308P is formed of a gate cut material 312P inserted into a slice 314P formed in the gate 302 and the gate cut 308N is formed from a gate cut material 312N inserted into a slice 314P in the gate 302. As explained in more detail below, the gate cut materials 312P and 312N each provides one of a tensile force and a compressive force on the gate 302 in the second (Y-axis) direction. The forces exerted by the gate cuts 308P and 308N on the gate 302 are transferred to the channel regions 310P and 310N. That is, the gate 302 is formed of a gate material 316 (e.g., polysilicon) that, under the force exerted by the gate cuts 308P and 308N does not deform to absorb the entire force in an elastic manner. Rather, due to rigidity of the gate material 316, in response to receiving the force exerted at the gate cut 308P, for example, the gate material 316 provides a corresponding force on the channel region 310P of the fins 304P(0)-304P(1). Such forces may be either compressive or tensile. In this manner, the gate cuts 308P and 308N may cause the gate 302 to exert forces on the fins 304P(0)-304P(1) and 304N(0)-304N(1), respectively. In other words, the gate cuts 308P and 308N may be seen as indirectly exerting forces on the fins 304P(0)-304P(1) and 304N(0)-304N(1). As more readily understood in view of FIG. 4, gate cuts disclosed herein, such as the gate cuts 308P and 308N, include features that cause complementary forces in two directions, orthogonal to each other, to be exerted on the fins.

Figure 4:
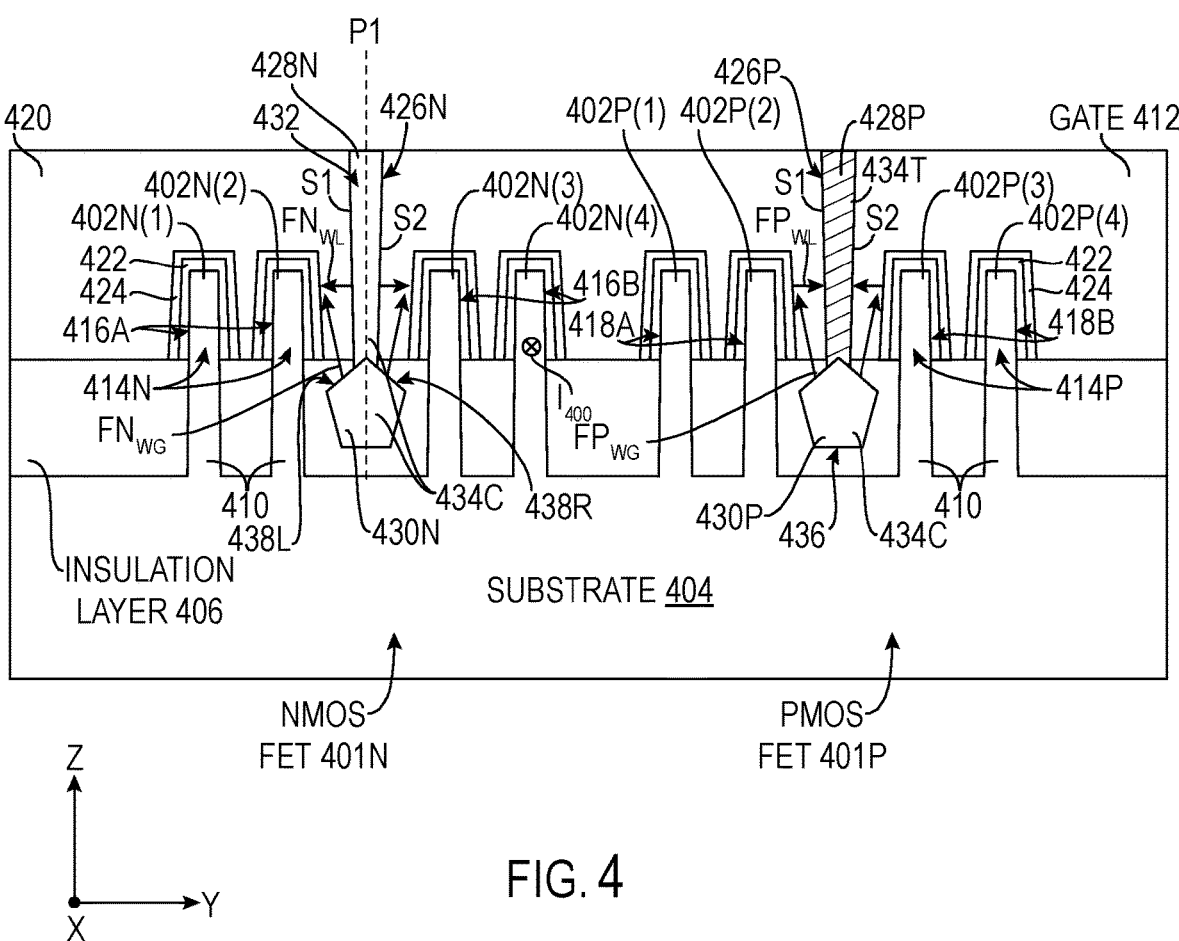
FIG. 4 is a cross-sectional side view of an NMOS FinFET and a PMOS FinFET, each including gate cuts, including a gate cut wall and a gate cut wedge to cause the gate to exert forces in a first direction and a second direction on the fins.

FIG. 4 is a cross-sectional side view of a CMOS FinFET structure 400, including an NMOS FinFET 401N and a PMOS FinFET 401P. The CMOS FinFET structure 400 may include the CMOS FinFET structure 300 in FIG. 3. The NMOS FinFET 401N and the PMOS FinFET 401P include semiconductor slabs (fins) 402N(1)-402N(4) and 404P(1)-402P(4) extending vertically (Z-axis direction) from a substrate 404. The fins 402N(1)-402N(4) and 404P(1)-402P(4) may be referred to collectively as fins 402N and 402P, respectively. Current flow 1400 in the fins 402N and 402P is in the first direction (X-axis direction). An insulation layer 406, formed of a shallow trench isolation (STI) material 408, for example, (not shown), is disposed on the substrate 404 and covers inactive portions 410 of the fins 402N and 402P, which are features of the substrate 404. A gate 412 is disposed over the fins 402N and 402P in channel regions 414N and 414P. The channel regions 414N and 414P are a region of the fins 402N and 402P under the gate 412, where the gate 412 is disposed on semiconductor slabs (fins) and where a voltage applied to the gate 412 can induce a conductive channel below the surface of the semiconductor slab. In the channel regions 414N and 414P, each of the fins 402N includes a first face 416A opposite to a second face 416B and each of the fins 402P includes a first face 418A opposite to a second face 418B. The gate 412 is formed of a gate material 420 and is disposed on the first faces 416A and the second faces 416B of the fins 402N and on the first faces 418A and the second faces 418B of the fins 402P. The fins 402N and 402P are separated from the gate 412 by dielectric layers 422 and work-function metal layers 424. The work-function metal layers 424 on the fins 402N may be different than the work-function metal layers 424 on the fins 402P.

To improve carrier mobility in the channel regions 414N and 414P, which increases performance (e.g., drive strength), the NMOS FinFET 401N and the PMOS FinFET 401P include exemplary gate cuts 426N and 426P, respectively. The gate cuts 426N and 426P extend through the gate material 420 adjacent, in the second direction (Y-axis direction), to the channel regions 414N and 414P of the fins 402N and 402P. The gate cuts 426N and 426P cause the gate 412 to exert force in the second direction on the channel regions 414N and 414P. In particular, the gate cuts 426N and 426P include gate cut walls 428N and 428P to exert forces $FN_{WL}$ and $FP_{WL}$, respectively, in the second direction (Y-axis direction) on the gate 412, which in turn exerts force on the channel regions 414N and 414P. The gate cuts 426N and 426P also include gate cut wedges 430N and 430P to exert forces $FN_{WG}$ and $FP_{WG}$ indirectly (via the gate 412) on the channel regions 414N and 414P, which include components in the second direction (Y-axis direction) and also in the third direction (Z-axis direction).

In FIG. 4, the gate cut 426N is disposed in the gate material 420 between, in the second direction, the fin 402N(2) and the fin 402N(3). As explained further below, after a section or slice 432 of the gate 412 is removed (e.g., trench etching), the gate material 420 is replaced with the gate cut wall 428N, which may comprise a first gate cut material 434C that exerts a compressive (pushing outward) force on the gate material 420, or a second gate cut material 434T that exerts a tensile (pulling inward) force on the gate material 420. The gate cut wall 428N extends in a plane P1 orthogonal to the second direction and is in contact with the insulation layer 406 between the gate 412 and the substrate 404. In this example, the gate cut wall 428N comprises the gate cut material 434C as determined by the direction of force to be exerted and the type of MOS material of the NMOS FinFET 401N. As previously noted, the gate cut wall 428N exerts forces $FN_{WL}$ in the second direction (Y-axis) orthogonal to the gate cut wall 428N. The forces $FN_{WL}$ are also orthogonal (or substantially orthogonal) to the faces 416A and 416B, which correspond to the z1-axis direction in FIG. 1. Referring back to Table A, carrier mobility is improved in an NMOS semiconductor slab in response to a compressive force orthogonal to the faces 416A and 416B. Thus, the gate cut material 434C is employed in the gate cut wall 428N to provide the force $FN_{WL}$ as a compressive force in this example.

The gate cut material 434C is selected from among materials (e.g., silicon nitride (SiN)) known to expand after formation (e.g., upon cooling). As such, the gate cut material 434C exerts forces orthogonal to (e.g., pushing in on) sides S1/S2 of the section or slice 432 removed from the gate 412. In response, the rigid structure of the gate 412 transfers this force in the second direction into the faces 416A and 416B of the fins 402N in a direction orthogonal to the faces 416A and 416B. In this manner, the gate cut wall 428N improves carrier (electron) mobility in the NMOS semiconductor slabs 402N.

The gate cut 426P includes a gate cut wall 428P corresponding to the gate cut wall 428N and is located in a same relative position to the fins 402P as the gate cut 426N relative to the fins 402N. Depending on the magnitude of the forces desired from the gate cuts 426N and 426P, they may be of the same thicknesses (in the second direction) or different thicknesses. However, in contrast to the gate cut material 434C, a gate cut material 434T is employed in the gate cut wall 428P because it contracts upon cooling, causing the gate cut wall 428P to pull inward rather than pushing outward in a direction orthogonal to the sides S1/S2 of the gate 412P. This pulling exerts a tensile force in the second direction on gate 412, which is transferred to a tensile force on the channel region 414P, improving carrier (hole) mobility in the PMOS semiconductor slabs 402P.

With continued reference to the NMOS FinFET 401N in FIG. 4, after removing a section or slice 432 of the gate 412 in which the gate cut wall 428N can be formed, a void 436 may be formed in the insulation layer 406. In one example, a chemical etchant that is selective to the insulation material may be introduced into the slice 432. Here, the gate cut wedge 430N is grown as a crystalline structure having a first surface 438L and a second surface 438R. The gate cut wedge 430N may be formed of the gate cut material 434C (or similar type of material) of which the gate cut wall 428N is formed, to exert the force $FN_{WG}$ as a compressive force, or the gate cut material 434T (or a similar type of material) may be employed to exert the force $FN_{WG}$ as a tensile force. The force $FN_{WG}$ exerted by the first surface 438L includes components in the second direction (Y-axis) and the third direction (Z-axis).

The second direction in FIG. 4 corresponds to the z2-axis direction in FIG. 2 and the z1-axis in FIG. 1, which are orthogonal to the faces 416A and 416B of the fins 402N. This force $FN_{WG}$ adds to the force $FN_{WL}$ in the second direction exerted by the gate cut wall 428N. Thus, a first force in the second direction exerted by the gate cut 426N includes a first portion (i.e., the force $FN_{WL}$) in the second direction and a second portion in the second direction (i.e., a component of the force $FN_{WG}$). The second force exerted by the gate cut 426N in the third direction (i.e., the component in the third direction of the force $FN_{WG}$) in FIG. 4 corresponds to the y1-axis and y2-axis directions in FIGS. 1 and 2, respectively, across the faces 416A and 416B and orthogonal to the current flow direction (X-axis direction). The component of vertical force (third direction) by the gate cute wedge 430N on the gate 412 creates a tensile force in the third direction (e.g., pulling upward) on the fins 402N. Both components (directions) of the force $FN_{WG}$ improve carrier mobility in the fins 402N.

In the PMOS FinFET 401P, the force $FP_{WL}$ is a tensile force orthogonal to the faces 418A and 418B (e.g., in the z1-axis direction in FIG. 1) (i.e., the second direction) for improving carrier mobility in the fins 402P. Therefore, the gate cut wall 428P is formed of the gate cut material 434T. Referring again to Table A, both NMOS and PMOS semiconductor slabs have improved carrier mobility in response to tensile lateral forces (e.g., in the y1-axis direction in FIG. 1), which may be provided by the gate cut wedge 430P. Therefore, the gate cut wedge 430P in the gate cut 426P is formed of the first gate cut material 434C. In this case, the gate cut wall 428P and the gate cut wedge 430P are formed of different materials, such that the gate cut wall 428P is exerting a tensile force in the second direction while a component of a force $FP_{WG}$ exerted by the gate cut wedge 430P in the second direction is compressive. In this regard, the force $FP_{WG}$ may offset some of the force $FP_{WL}$ of the gate cut wall 428P in the second direction. Even though the gate cut wedge 430P may reduce the beneficial force provided by the gate cut wall 428P in the second direction, this reduction may be a satisfactory compromise in view of the improvement in carrier mobility provided by the component of the tensile force $FP_{WG}$ that the gate cut wedge 430P exerts, indirectly via the gate 412, on the fins 402P in the third direction (laterally).

Figure 5:
FIG. 5 is a top view of a CMOS GAA FET structure, including an NMOS nanosheet stack and a PMOS nanosheet stack, and gate cuts to improve carrier mobility.
Figure 5:
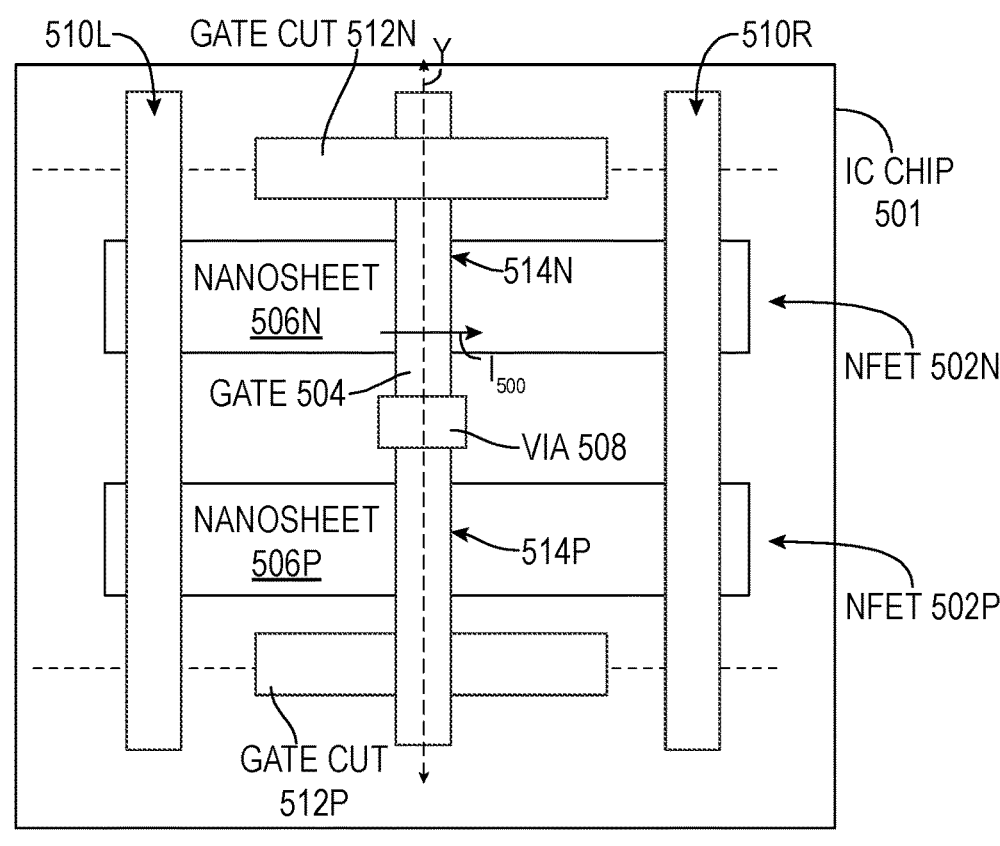

FIG. 5 is a top view of a CMOS gate-all-around (GAA) FET structure 500 (GAA FET structure 500), including an NFET 502N and PFET 502P. The GAA FET structure 500 is included in an IC chip 501 and includes a gate 504, a nanosheet 506N in the NFET 502N, and a nanosheet 506P in the PFET 502P. In operation, current $I_{500}$ flows in the first, horizontal direction (X-axis direction) longitudinally through the nanosheets (e.g., semiconductor slabs) 506P and 506N. The gate 504 extends across the nanosheets 506N and 506P in the second, horizontal direction (Y-axis direction). The gate 504 may be coupled in the third, vertical direction (Z-axis direction) to a metal interconnect (not shown) by via 508. The GAA FET structure 500 also includes dummy gates 510L and 510R, which may be electrically inactive.

The GAA FET structure 500 also includes gate cut 512N in the gate 504 adjacent to a channel region 514N of the nanosheet 506N and a gate cut 512P in the gate 504 adjacent to a channel region 514P of the nanosheet 506P. As described in more detail with reference to FIG. 6, the gate cuts 512N and 512P exert forces in the second direction (Y-axis direction) to improve carrier mobility in both NMOS and PMOS semiconductor slabs.

Figure 6:
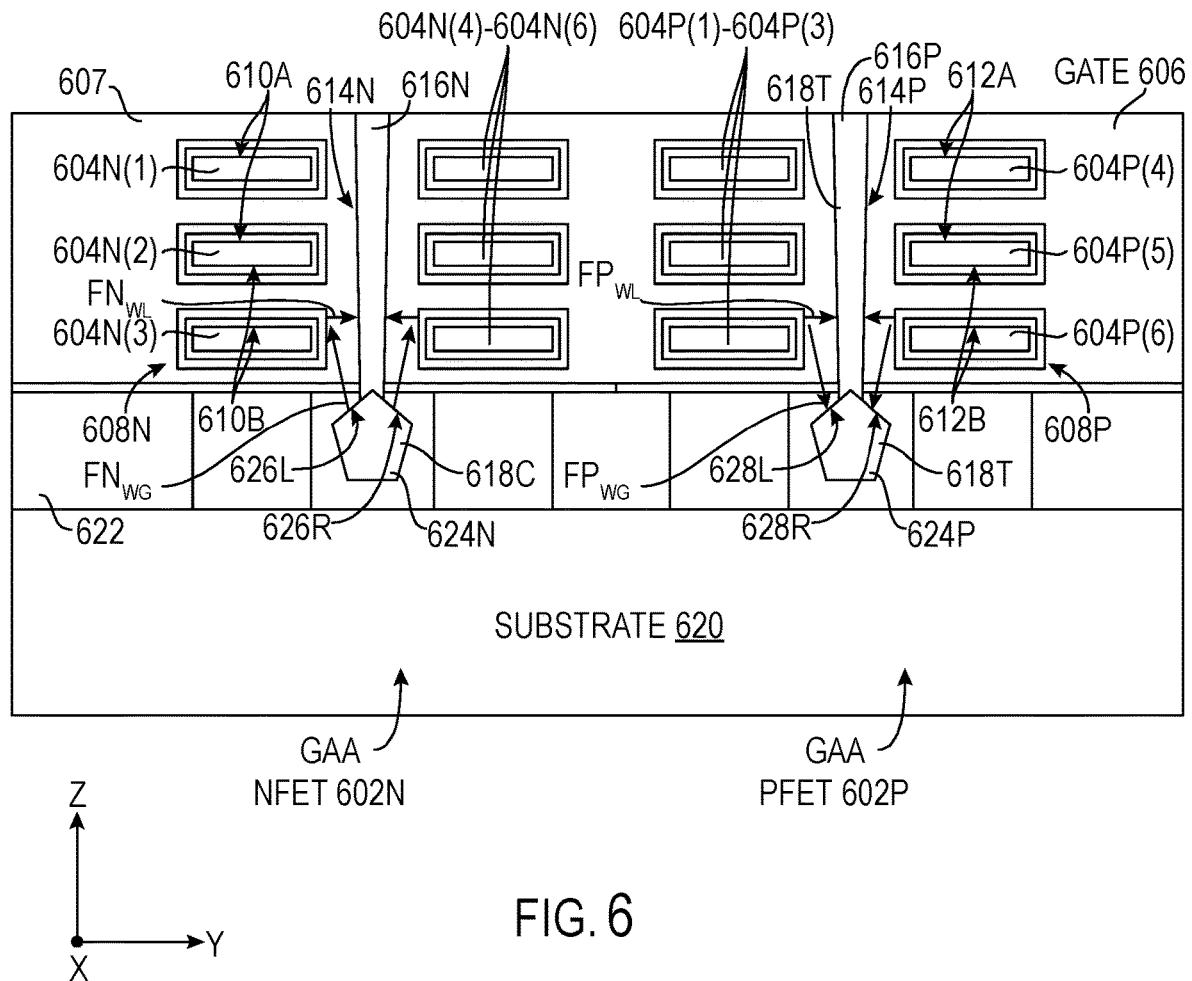
FIG. 6 is a cross-sectional side view of a first example of a CMOS circuit including an NMOS GAA FET and a PMOS GAA FET, each including two nanosheet stacks and a gate cut, where the gate cut includes a gate cut wall and a gate cut wedge to cause the gate to exert forces in a first direction and a second direction on the nanosheets.

FIG. 6 is a cross-sectional side view of a first example of a CMOS GAA FET structure (GAA FET structure 600), which could include the GAA FET structure 500 in FIG. 5. The GAA FET structure 600 includes a GAA NFET 602N and a GAA PFET 602P, having vertically stacked nanosheets 604N(1)-604N(6) and 604P(1)-604P(6), respectively. The nanosheets 604N(1)-604N(6) and 604P(1)-604P(6) may be referred to collectively as nanosheets 604N and 604P, respectively. The cross-sectional side view in FIG. 6 is a cross-section in the second direction (Y-axis direction) and the third direction (Z-axis direction) along a gate 606, which extends through channel region 608N of nanosheets 604N (1)-604N(6) and channel region 608P of the nanosheets 604P(1)-604P(6). The gate 606 comprises a gate material 607. A voltage applied to the gate 606 can induce conductive channels in faces 610A and 610B of the nanosheets 604N and, alternatively, can induce conductive channels in faces 612A and 612B of the nanosheets 604P.

The GAA FET structure 600 includes a gate cut 614N disposed between the nanosheets 604N(1)-604N(3) and the nanosheets 604N(4)-604N(6), and a gate cut 614P disposed between the nanosheets 604P(1)-604P(3) and the nanosheets 604P(4)-604P(6). The gate cut 614N includes a gate cut wall 616N that causes the gate 606 to exert a force $FN_{WL}$ on the gate 606 in the second direction (Y-axis), which is lateral to or across the direction of a current $I_{600}$ (y2-axis in FIG. 2). As indicated in Table A, a tensile force in the lateral direction provides a beneficial improvement to carrier mobility in an NMOS semiconductor slab, whether it is a fin or a nanosheet. Thus, the gate cut wall 616N is formed of a gate cut material 618T to exert a force $FN_{WL}$ as a tensile force in the second direction (Y-axis direction) to cause the gate 606 to exert a force on the nanosheets 604P in the channel region 608N. The gate cut material 618T may be a tensile oxide (e.g., SiO2), or another material that contracts in size upon cooling after deposition. The gate cut material 618T exerts a tensile or pulling force on the gate 606, which in turn exerts a tensile or pulling force in the second direction (laterally), causing a corresponding force on the nanosheets 604N(1)-604N(3) and 604N(4)-604N(6).

The GAA FET structure 600 is formed on a substrate 620 and includes an insulation layer (e.g., STI layer) 622 between the substrate 620 and the nanosheets 604N and 604P. The gate cut 614N also includes a gate cut wedge 624N disposed in the insulation layer 622, between the gate cut wall 616N and the substrate 620. The gate cut wedge 624N includes faces 626L and 626R that each provide components of forces in the second direction and the third direction. As noted in Table A, the direction of a beneficial force orthogonal to the faces 610A and 610B in NMOS semiconductor slabs is compressive. Thus, a gate cut material 618C is employed to form the gate cut wedge 624N to exert an upward (vertical) force. Although the gate cut wedge 624N being formed of the gate cut material 618C also has a compressive component in the second direction, which is contrary to the beneficial tensile force provided by the gate cut wall 616N, this may be determined to be a satisfactory compromise in view of the benefits provided by the compressive force orthogonal to the faces 610A and 610B in the third direction. In this regard, the gate cut material 618T in the gate cut wedge 624N is configured to exert a first force component in the second direction and a second force component in the third direction that are both compressive forces.

As noted in Table A, tensile forces in the second direction (lateral to the nanosheets 604N and 604P) are beneficial for both NMOS and PMOS semiconductor slabs. Thus, the gate cut 614P includes a gate cut wall 616P that is also formed of the gate cut material 618T to exert force $FP_{WL}$ as tensile forces in the second direction. In contrast to the gate cut wedge 624N, which provides a compressive force in the third direction on the nanosheets 604N, the gate cut wedge 624P of the gate cut 614P is formed of the gate cut material 618T to exert a force $FP_{WG}$ as a tensile force in the third direction, orthogonal to the faces 612A and 612B of the nanosheets 604P. The gate cut wedge 624P includes faces 628L and 628R with components in the third direction and also in the second direction. Here, the faces 628L and 628R assist the gate cut wall 628P in providing the tensile force in the second direction.

Figure 7:
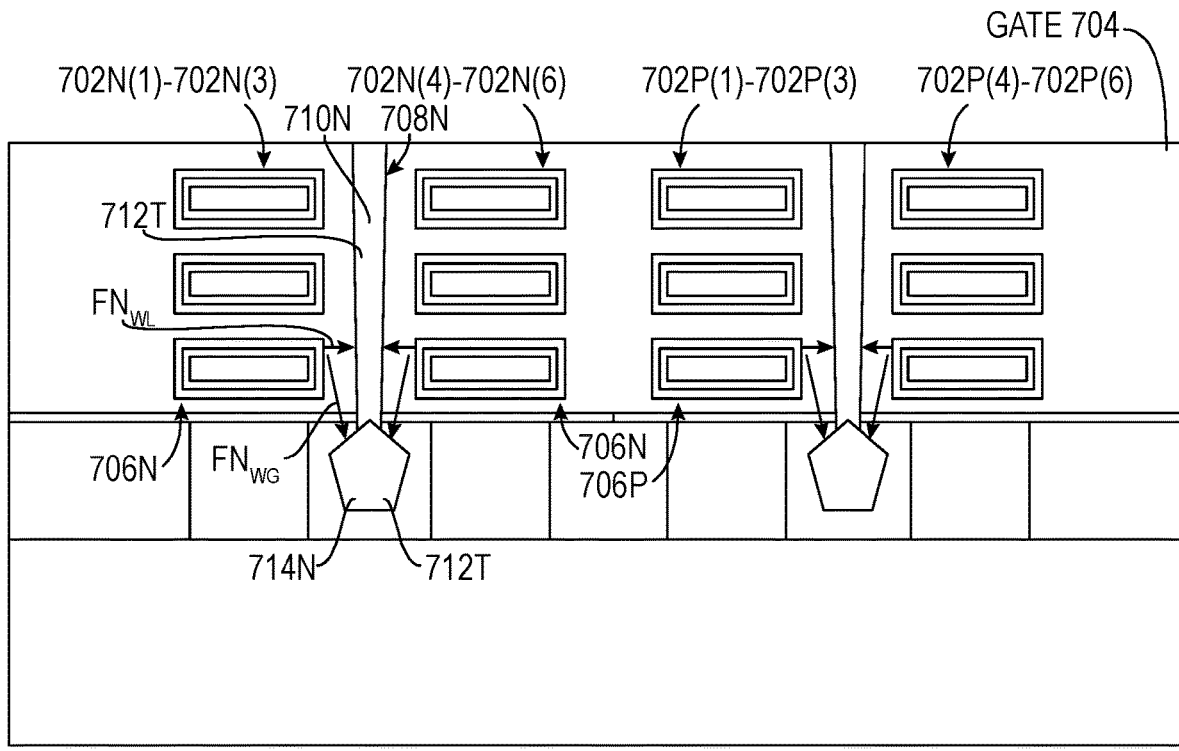
FIG. 7 is a cross-sectional side view of a second example of a CMOS circuit including an NMOS GAA FET and a PMOS GAA FET, each including two nanosheet stacks and a gate cut, where the gate cut includes a gate cut wall and a gate cut wedge to cause the gate to exert forces in a first direction and a second direction on the nanosheets.

FIG. 7 is a cross-sectional side view of a second example of a CMOS GAA FET circuit structure 700 (GAA FET structure 700), including NMOS nanosheets 702N(1)-702N (6) (nanosheets 702N) and PMOS nanosheets 702P(1)-702P (6) (nanosheets 702P). The GAA FET structure 700 includes a gate 704 disposed over channel regions 706N and 706P of the nanosheets 702N and 702P. A gate cut 708N is disposed between the NMOS nanosheets 702N(1)-702N(3) and the nanosheets 702N(4)-702N(6) to exert forces in the second direction and the third direction to improve carrier mobility. The GAA FET structure 700 is identical in all aspects to the GAA FET structure 600 in FIG. 6 except with regard to the gate cut 708N. Like the gate cut 614N in FIG. 6, in which the gate cut wall 616N is formed of the gate cut material 618T to exert the force $FN_{WL}$ as a tensile in the second direction, the gate cut 708N also includes a gate cut wall 710N formed of a gate cut material 712T (or a similar material) selected to exert a force $FN_{WL}$ as a tensile force in the second direction. However, unlike the gate cut wedge 624N, which is formed of the gate cut material 618C to provide a compressive force, a gate cut wedge 714N is formed of the gate material 712T to exert a force $FN_{WG}$ having components in both the second direction and the third direction that are tensile forces. The tensile force in the second direction contributes to the force $FN_{WL}$ in the second direction exerted by the gate cut wall 710N, while a component of tensile force exerted in the third direction on the NMOS nanosheets 702N is opposite to the force in the third direction on the NMOS nanosheets 604N in FIG. 6. In some examples, a tensile force component in the third direction in FIG. 7 from the gate cut wedge 714N may provide a more improved carrier mobility than the upward component exerted in FIG. 6. In some examples, a tensile force $FN_{WG}$ in the third direction may provide a better improvement to the nanosheets 702N(1)-702N(6) than the compressive force $FN_{WG}$ in FIG. 6.

Figure 8:
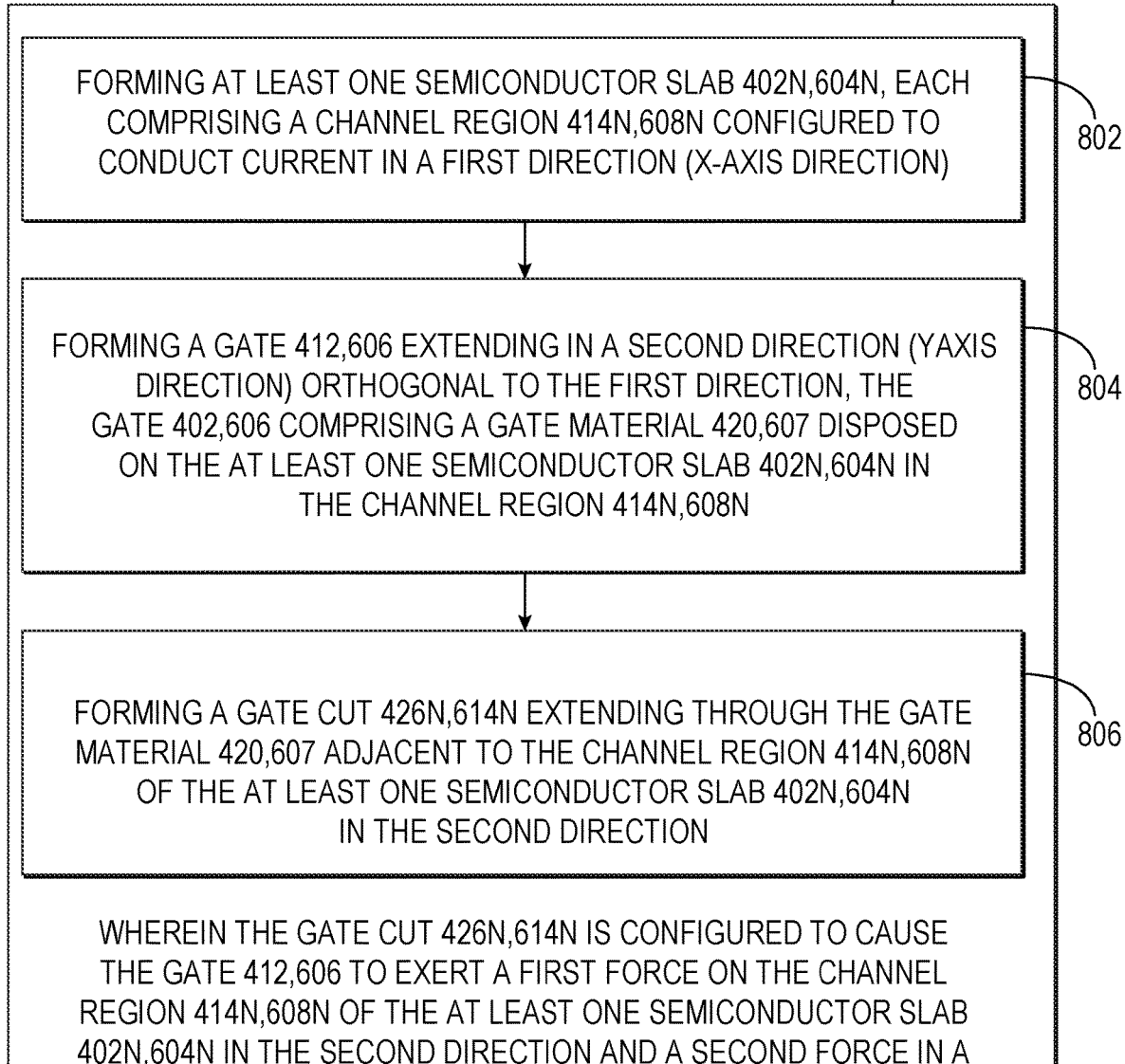
FIG. 8 is a flowchart illustrating a method of fabricating 3D FETs, including any of the PFETs and NFETs in FIGS. 3-7, including gate cuts formed adjacent to the semiconductor slabs (e.g., nanosheets) to cause the gate to exert forces on the channel regions in two directions to improve carrier mobility.

FIG. 8 is a flowchart illustrating a method 800 of fabricating a 3D FET structure, including any of the FET structures in FIGS. 3-7, including gate cuts formed adjacent to semiconductor slabs to cause a gate to exert forces on the channel regions to improve carrier mobility. The method includes forming at least one semiconductor slab 402N, 604N, each comprising: a channel region 414N,608N configured to conduct current in a first direction (X-axis direction); and a first face 416A,610A and a second face 416B, 610B opposite to each other (block 802); forming a gate 412,606 extending in a second direction (Y-axis direction) orthogonal to the first direction, the gate 412,606 comprising a gate material 420,607 disposed on the first face 416A, 610A and the second face 416B,610B of each of the at least one semiconductor slab 402N,604N in the channel region 414N,608N (block 804); and forming a gate cut 426N,614N extending through the gate material 420,607 adjacent to the channel region 414N,608N of the at least one semiconductor slab 402N,604N in the second direction (block 806), wherein the gate cut 426N,614N is configured to cause the gate 412,606 to exert a first force on the channel region 414N,608N of the at least one semiconductor slab 402N, 604N in the second direction.

FIGS. 9A-9D are exemplary fabrication stages during fabrication of a 3D FinFET, including a gate cut in a gate and adjacent to the semiconductor slabs (e.g., fins) to exert forces that improve carrier mobility, including the CMOS FinFET structures in FIGS. 3 and 4, and according to the exemplary fabrication process 1100 in the flowchart in FIGS. 11A-11D. FIGS. 10A-10D are corresponding fabrication stages of fabrication of a gate cut in a GAA FET adjacent to the gate for improved carrier mobility, including the GAA FET structures in FIGS. 5-7, and may also be fabricated according to the fabrication process 1100 in FIGS. 11A-11D.

Figures 9A, 10A, 11A:
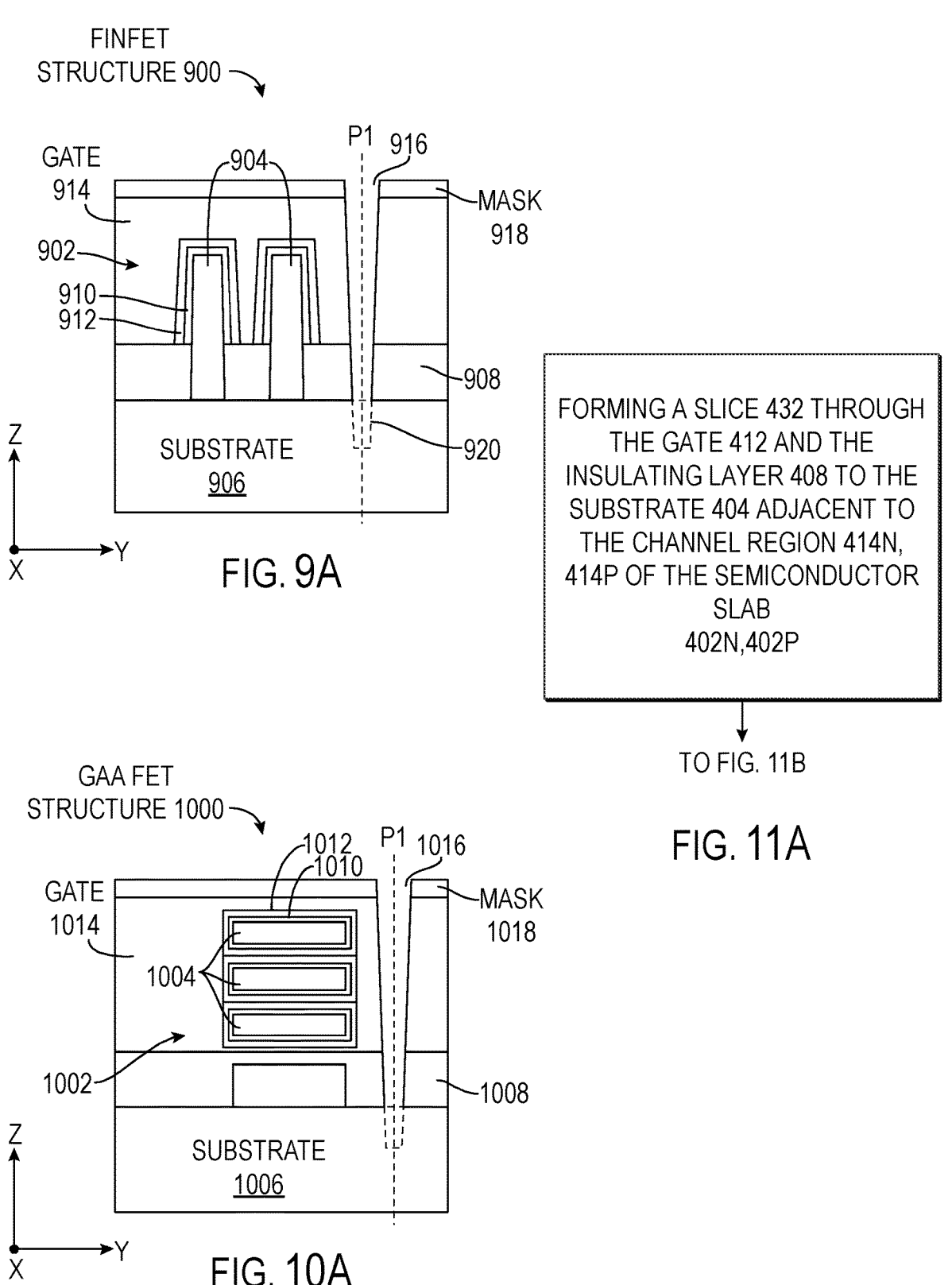

FIG. 9A is a cross-sectional side view of a FinFET structure 900 in a first fabrication stage 900A in a channel region 902 of semiconductor slabs (fins) 904 formed on a substrate 906. The channel region 902 is configured to conduct current in the fins 904 in a first direction. The FinFET structure 900 includes an insulation layer 908 formed on the substrate 906, a dielectric layer 910 formed on the fins 904 and a work function layer 912 formed on the dielectric layer 910. The FinFET structure 900 also includes a gate 914 disposed over the semiconductor slabs 904 in a second direction in the channel region 902. The gate 914 is also disposed on the insulation layer 908. Features of the FinFET structure 900 in FIGS. 9B-9D that are also shown in FIG. 9A are labeled the same.

FIG. 10A is a cross-sectional side view of a GAA FET structure 1000 in a first fabrication stage 1000A in a channel region 1002 of semiconductor slabs (nanosheets) 1004 formed on a substrate 1006. The channel region 1002 is configured to conduct current in the nanosheets 1004 in a first direction. The GAA FET structure 1000 includes an insulation layer 1008 disposed on the substrate 1006, dielectric layer 1010 formed on the nanosheet 1004 and a work function layer 1012 formed on the dielectric layer 1010. The GAA FET structure 1000 also includes a gate 1014 disposed over the semiconductor slabs 1004 in a second direction in the channel region 1002. The gate 1014 is also formed on the insulation layer 1008. Features of the GAA FET structure 1000 shown in FIGS. 10B-10D that are also shown in FIG. 10 are labeled the same.

As shown in FIG. 11A, the method of forming a gate cut 915,1015 (see FIGS. 9C/9D and 10C/10D), as shown in FIG. 9A and FIG. 10A, includes a step 1100A of forming a slice 916,1016 through the gate 914,1014 and through the insulation layer 908,1008 adjacent to the channel region 902,1002 of the semiconductor slab 904,1004. A mask 918,1018 on the gate 914,1014 may be employed to determine a location of the slice 916,1016. In some examples, optional extensions 920,1020 of the slice 916,1016 may extend into the substrate 906,1006. The slice 916,1016 extends along a plane P1 orthogonal to the second direction. FIGS. 9A and 10A also show optional extensions 920,1020 of the slice 916,1016 that may also be formed according to the method in FIG. 11A. The slice 916,1016 extends in a plane P1 orthogonal to the second direction.

Figures 9B, 10B, 11B:
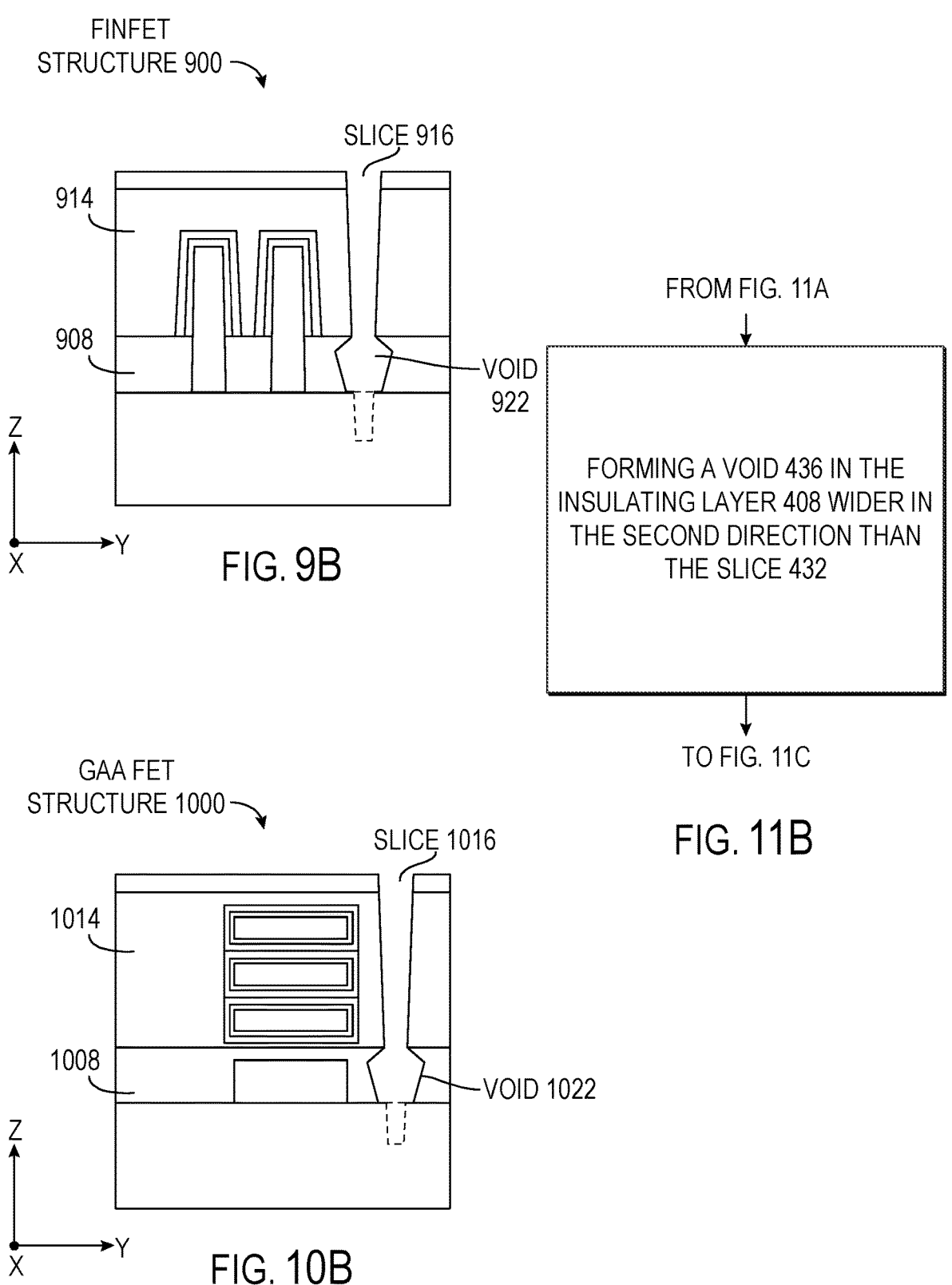

FIGS. 9B and 10B illustrate second fabrication stages 900B and 1000B, respectively, of the FinFET structure 900 and the GAA FET structure 1000 according to the method illustrated in FIG. 11B. The method further includes forming a void 922,1022 in the insulation layer 908,1008 wider in the second direction than the slice 916,1016 in the gate 914, 1014.

Figures 9C, 10C, 11C:
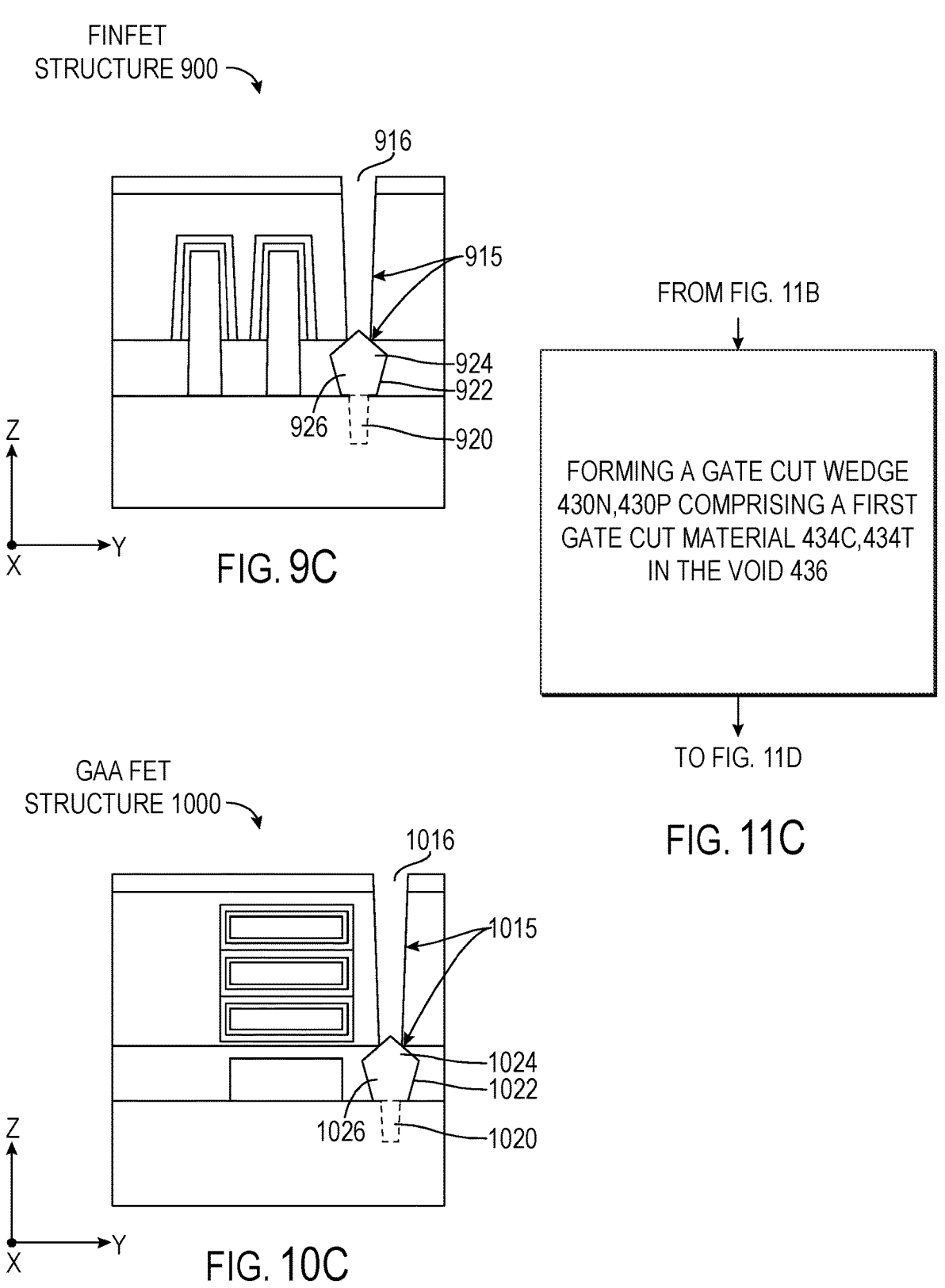

FIGS. 9C and 10C illustrate third fabrication stages 900C and 1000C, respectively, of the FinFET structure 900 and the GAA FET structure 1000 according to the method illustrated in FIG. 11C. The method further includes forming the gate cut 915,1015 in the void 922,1022 and in the slice 916,1016. Forming the gate cut includes forming a gate cut wedge 924,1024 comprising a first gate cut material 926,1026 in the void 922,1022. In the case in which the slice 916,1016 includes an extension 920,1020, then the extension 920, 1020 is also filled with the first gate cut material 926,1026.

FIGS. 9D and 10D illustrate fourth fabrication stages 900D and 1000D, respectively, of the FinFET structure 900 and the GAA FET structure 1000 according to the method illustrated in FIG. 11D. The method of forming the gate cut 915,1015 includes forming a gate cut wall 928,1028 comprising a second gate cut material 930,1030 in the slice 916,1016. In some examples, the first gate cut material 926,1026 is the same as the second gate cut material 930,1030.

Electronic devices that include 3D FETs, including gate cuts in the gates adjacent to channel regions to cause the gate to exert forces on the semiconductor slabs to improve carrier mobility to increase drive strength in FIGS. 3-7, and according to any aspects disclosed herein, may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, laptop computer, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 12:
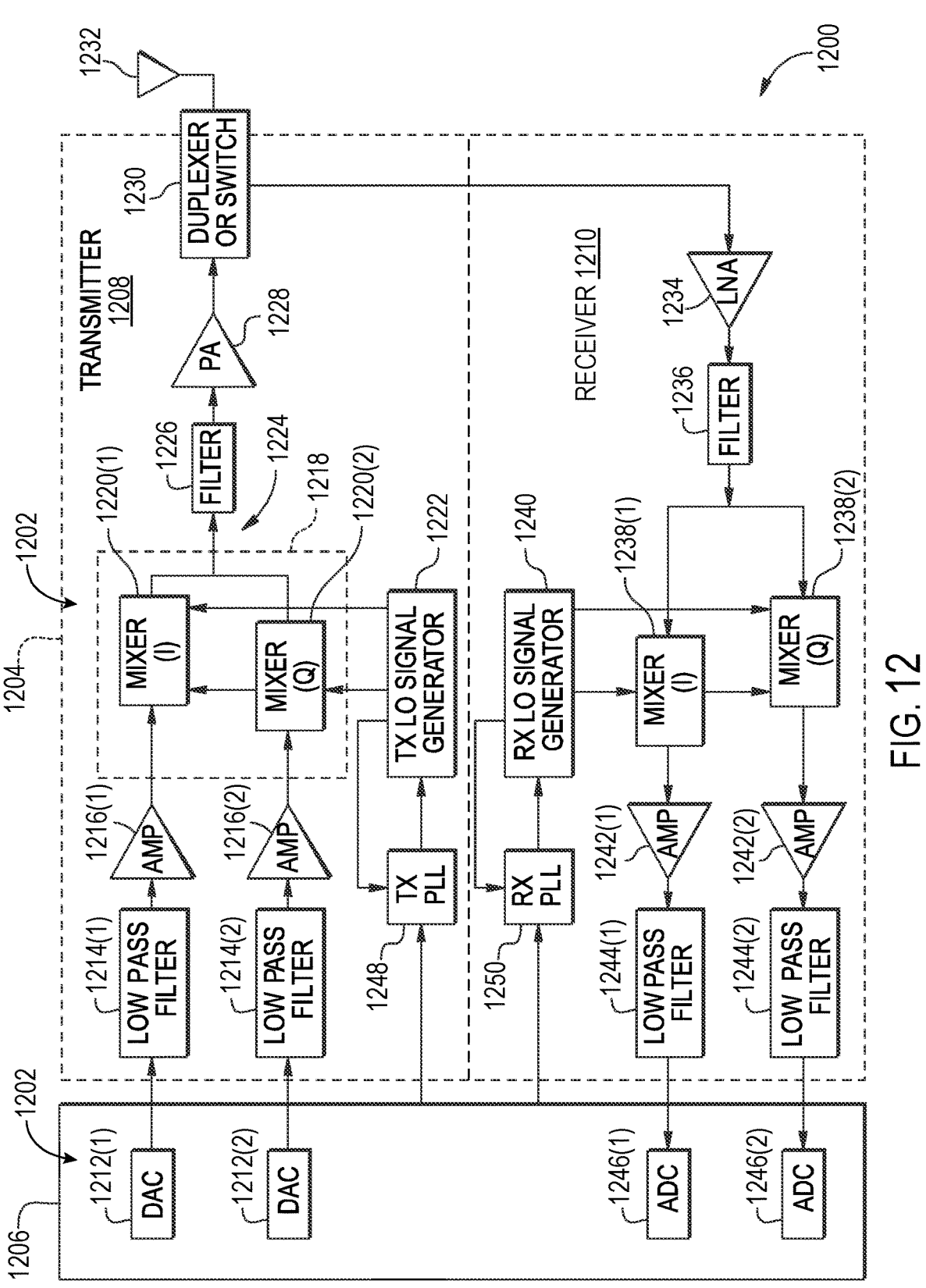
FIG. 12 is a block diagram of an exemplary wireless communication device that includes radio-frequency (RF)

In this regard, FIG. 12 illustrates a block diagram of an exemplary wireless communications device 1200 that includes radio frequency (RF) components formed from one or more ICs 1202, wherein any of the ICs 1202 can include integrated circuits, including 3D FETs, including gate cuts in the gates adjacent to channel regions to cause the gate to exert forces on the semiconductor slabs to improve carrier mobility to increase drive strength in FIGS. 3-7, and according to any aspects disclosed herein. The wireless communications device 1200 may include or be provided as examples in any of the above-referenced devices. As shown in FIG. 12, the wireless communications device 1200 includes a transceiver 1204 and a data processor 1206. The data processor 1206 may include a memory to store data and program codes. The transceiver 1204 includes a transmitter 1208 and a receiver 1210, which support bi-directional communications. In general, the wireless communications device 1200 may include any number of transmitters 1208 and/or receivers 1210 for any number of communication systems and frequency bands. All or a portion of the transceiver 1204 may be implemented on one or more analog ICs, RF ICs (RFICs), mixed-signal ICs, etc.

The transmitter 1208 or the receiver 1210 may be implemented with a super-heterodyne or direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 1200 in FIG. 12, the transmitter 1208 and the receiver 1210 are implemented with the direct-conversion architecture.

In the transmit path, the data processor 1206 processes data to be transmitted and provides I and Q analog output signals to the transmitter 1208. In the exemplary wireless communications device 1200, the data processor 1206 includes digital-to-analog converters (DACs) 1212(1), 1212(2) for converting digital signals generated by the data processor 1206 into I and Q analog output signals, e.g., I and Q output currents, for further processing.

Within the transmitter 1208, lowpass filters 1214(1), 1214(2) filter the I and Q analog output signals, respectively, to remove undesired signals caused by the prior digital-to-analog conversion. Amplifiers (AMPs) 1216(1), 1216(2) amplify the signals from the lowpass filters 1214(1), 1214(2), respectively, and provide I and Q baseband signals. An upconverter 1218 upconverts the I and Q baseband signals with I and Q transmit (TX) local oscillator (LO) signals from a TX LO signal generator 1222 through mixers 1220(1), 1220(2) to provide an upconverted signal 1224. A filter 1226 filters the upconverted signal 1224 to remove undesired signals caused by the frequency upconversion and noise in a receive frequency band. A power amplifier (PA) 1228 amplifies the upconverted signal 1224 from the filter 1226 to obtain the desired output power level and provides a transmit RF signal. The transmit RF signal is routed through a duplexer or switch 1230 and transmitted via an antenna 1232.

In the receive path, the antenna 1232 receives signals transmitted by base stations and provides a received RF signal, which is routed through the duplexer or switch 1230 and provided to a low noise amplifier (LNA) 1234. The duplexer or switch 1230 is designed to operate with a specific receive (RX)-to-TX duplexer frequency separation, such that RX signals are isolated from TX signals. The received RF signal is amplified by the LNA 1234 and filtered by a filter 1236 to obtain a desired RF input signal. Down-conversion mixers 1238(1), 1238(2) mix the output of the filter 1236 with I and Q RX LO signals (i.e., LO_I and LO_Q) from an RX LO signal generator 1240 to generate I and Q baseband signals. The I and Q baseband signals are amplified by AMPs 1242(1), 1242(2) and further filtered by lowpass filters 1244(1), 1244(2) to obtain I and Q analog input signals, which are provided to the data processor 1206.

In this example, the data processor 1206 includes analog-to-digital converters (ADCs) 1246(1), 1246(2) for converting the analog input signals into digital signals to be further processed by the data processor 1206.

In the wireless communications device 1200 of FIG. 12, the TX LO signal generator 1222 generates the I and Q TX LO signals used for frequency upconversion, while the RX LO signal generator 1240 generates the I and Q RX LO signals used for frequency downconversion. Each LO signal is a periodic signal with a particular fundamental frequency. A TX phase-locked loop (PLL) circuit 1248 receives timing information from the data processor 1206 and generates a control signal used to adjust the frequency and/or phase of the TX LO signals from the TX LO signal generator 1222. Similarly, an RX PLL circuit 1250 receives timing information from the data processor 1206 and generates a control signal used to adjust the frequency and/or phase of the RX LO signals from the RX LO signal generator 1240.

Figure 13:
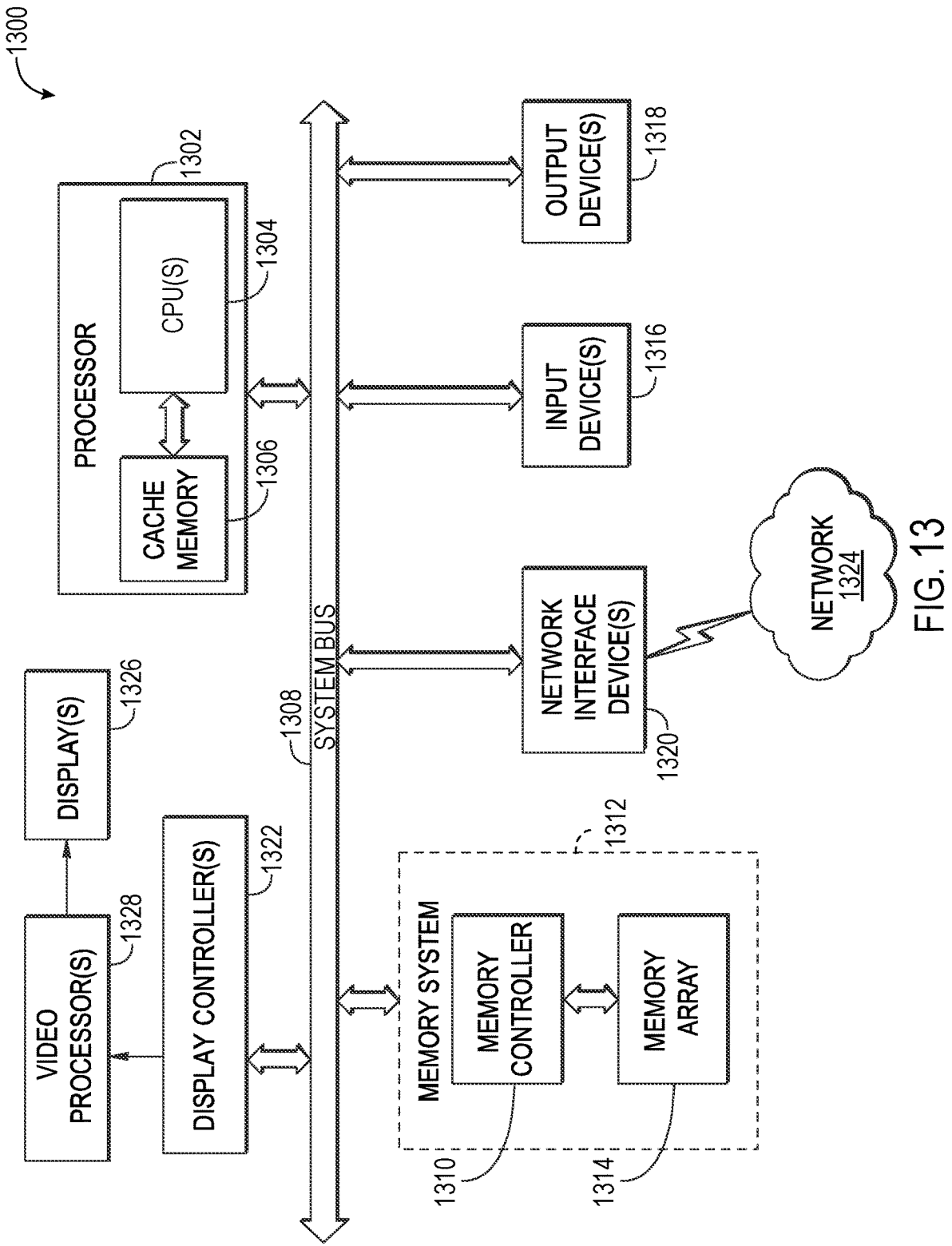
FIG. 13 is a block diagram of an exemplary processor-based system that can include the 3D dual complementary-circuit structure, including 3D FETs, including gate cuts in the gates adjacent to channel regions to cause the gate to exert forces in two directions on the semiconductor slabs to improve carrier mobility to increase drive strength, including but not limited to the 3D FETs in FIGS. 3-7 and according to, but not limited to, any of the exemplary fabrication processes of fabricating such 3D FETs in FIGS. 8 and 11A-11D.

FIG. 13 illustrates a block diagram of an example of a processor-based system 1300 that can employ integrated circuits, including 3D FETs, including gate cuts in the gates adjacent to channel regions to exert forces on the semiconductor slabs to improve carrier mobility to increase drive strength in FIGS. 3-7. In this example, the processor-based system 1300 includes one or more central processor units (CPUs) 1302, which may also be referred to as CPU or processor cores, each including one or more processors 1304. The CPU(s) 1302 may have cache memory 1306 coupled to the processor(s) 1304 for rapid access to temporarily stored data. The CPU(s) 1302 is coupled to a system bus 1308 and can intercouple master and slave devices included in the processor-based system 1300. As is well known, the CPU(s) 1302 communicates with these other devices by exchanging address, control, and data information over the system bus 1308. For example, the CPU(s) 1302 can communicate bus transaction requests to a memory controller 1310 as an example of a slave device. Although not illustrated in FIG. 13, multiple system buses 1308 could be provided wherein each system bus 1308 constitutes a different fabric.

Other master and slave devices can be connected to the system bus 1308. As illustrated in FIG. 13, these devices can include a memory system 1312 that includes the memory controller 1310 and one or more memory arrays 1314, one or more input devices 1316, one or more output devices 1318, one or more network interface devices 1320, and one or more display controllers 1322, as examples. The input device(s) 1316 can include any type of input device, including, but not limited to, input keys, switches, voice processors, etc. The output device(s) 1318 can include any type of output device, including, but not limited to, audio, video, other visual indicators, etc. The network interface device(s) 1320 can be any device configured to allow an exchange of data to and from a network 1324. The network 1324 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1320 can be configured to support any type of communications protocol desired.

The CPU(s) 1302 may also be configured to access the display controller(s) 1322 over the system bus 1308 to control information sent to one or more displays 1326. The display controller(s) 1322 sends information to the display(s) 1326 to be displayed via one or more video processors 1328, which process the information to be displayed into a format suitable for the display(s) 1326. The display(s) 1326 can include any type of display, including, but not limited to, a cathode ray tube (CRT), a liquid crystal display (LCD), a plasma display, or a light-emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium wherein any such instructions are executed by a processor or other processing device, or combinations of both. As examples, the devices and components described herein may be employed in any circuit, hardware component, integrated circuit (IC), or IC chip. Memory disclosed herein may be any type and size of memory and may be configured to store any desired information. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. Alternatively, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art. Those of skill in the art will also understand that information and signals may be represented using various technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

Implementation examples are described in the following numbered clauses:

1. A three-dimensional (3D) field-effect transistor (FET) structure, comprising:
   at least one semiconductor slab, each comprising a channel region configured to conduct a current in a first direction;
   a gate extending in a second direction orthogonal to the first direction, the gate comprising a gate material disposed on the at least one semiconductor slab in the channel region; and
   a gate cut extending through the gate material adjacent to the channel region of the at least one semiconductor slab in the second direction;
   wherein the gate cut is configured to cause the gate to exert a first force in the second direction and a second force in a third direction orthogonal to the second direction on the channel region of the at least one semiconductor slab.

2. The 3D FET structure of clause 1, wherein the gate cut comprises a gate cut wall configured to cause the gate to exert a first portion of the first force in the second direction.

3. The 3D FET structure of clause 2, wherein the gate cut further comprises a gate cut wedge configured to cause the gate to exert a second portion of the first force on the channel region of the at least one semiconductor slab in the second direction and cause the gate to exert the second force on the channel region of the at least one semiconductor slab in the third direction.

4. The 3D FET structure of clause 3, wherein the gate cut wall comprises a first gate cut material configured to cause the gate to exert the first portion of the first force comprising a compressive force.

5. The 3D FET structure of clause 4, wherein the gate cut wedge comprises a second gate cut material configured to cause the gate to exert each of the second portion of the first force and the second force comprising a compressive force.

6. The 3D FET structure of clause 5, wherein:
   the gate cut wall comprises silicon nitride (SiN); and
   the gate cut wedge comprises SiN.

7. The 3D FET structure of clause 4, wherein the gate cut wedge comprises a second gate cut material configured to cause the gate to exert each of the second portion of the first force and the second force comprising a tensile force.

8. The 3D FET structure of clause 7, wherein:
   the gate cut wall comprises silicon nitride (SiN); and
   the gate cut wedge comprises silicon dioxide ($SiO_2$).

9. The 3D FET structure of clause 3, wherein the gate cut wall comprises a first gate cut material configured to cause the gate to exert the first portion of the first force comprising a tensile force.

10. The 3D FET structure of clause 9, wherein the gate cut wedge comprises a second gate cut material configured to cause the gate to exert each of the second portion of the first force and the second force comprising a tensile force.

11. The 3D FET structure of clause 10, wherein:
   the gate cut wall comprises silicon dioxide ($SiO_2$); and
   the gate cut wedge comprises $SiO_2$.

12. The 3D FET structure of clause 9, wherein the gate cut wedge comprises a second gate cut material configured to cause the gate to exert each of the second portion of the first force and the second force comprising a compressive force.

13. The 3D FET structure of clause 12, wherein:
   the gate cut wall comprises silicon dioxide ($SiO_2$); and
   the gate cut wedge comprises silicon nitride (SiN).

14. The 3D FET structure of any of clauses 3-13, further comprising:
   a substrate; and
   an insulation layer disposed between the gate and the substrate in the third direction;
   wherein the gate cut wedge is disposed in the insulation layer between the gate cut wall and the substrate.

15. The 3D FET structure of clause 14, wherein:
   the gate cut wedge comprises a gate cut material having a first surface; and
   a force exerted by the first surface of the gate cut wedge comprises components in the second direction and in the third direction.

16. The 3D FET structure of clause 15, wherein the gate cut material is in contact with the insulation layer between the gate and the substrate.

17. The 3D FET structure of any of clauses 1-16, wherein the gate material is disposed between the gate cut and the at least one semiconductor slab.

18. The 3D FET structure of any of clauses 1-17, wherein:
   the 3D FET structure comprises a fin-type field effect transistor (FinFET); and
   the at least one semiconductor slab comprises at least one fin.

19. The 3D FET structure of any of clauses 1-17, wherein:
   the 3D FET structure comprises a gate-all-around (GAA) field effect transistor (FET); and
   the at least one semiconductor slab comprises at least one nanosheet.

20. The 3D FET structure of any of clauses 1-19 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

21. A method of fabricating a three-dimensional (3D) field-effect transistor (FET) structure, the method comprising:

forming at least one semiconductor slab, each comprising a channel region configured to conduct a current in a first direction;

forming a gate extending in a second direction orthogonal to the first direction, the gate comprising a gate material disposed on the at least one semiconductor slab in the channel region; and forming a gate cut extending through the gate material adjacent to the channel region of the at least one semiconductor slab in the second direction;

wherein the gate cut is configured to cause the gate to exert a first force in the second direction and a second force in a third direction orthogonal to the second direction on the channel region of the at least one semiconductor slab.

22. The method of clause 21, wherein:

forming the at least one semiconductor slab further comprises:

forming a first semiconductor slab on a substrate; and disposing an insulation layer on the substrate; and forming the gate further comprises forming the gate on the insulation layer.

23. The method of clause 22, further comprising:

forming a slice through the gate and the insulation layer to the substrate adjacent to the channel region of the at least one semiconductor slab;

forming a void in the insulation layer wider in the second direction than the slice; and forming the gate cut in the void and in the slice.

24 The method of clause 23, wherein:

forming the slice further comprises forming the slice extending along a plane orthogonal to the second direction; and forming the gate cut in the void and in the slice further comprises:

forming a gate cut wedge comprising a first gate cut material in the void; and forming a gate cut wall comprising a second gate cut material in the slice on the gate cut wedge.

25. A complementary metal-oxide semiconductor (CMOS) circuit structure comprising:

at least one first semiconductor slab, each comprising:

a first type dopant;

a first channel region configured to conduct a first current in a first direction;

a first source/drain region on a first side of the first channel region; and a second source/drain region on a second side of the first channel region;

a first gate extending in a second direction orthogonal to the first direction, the first gate comprising a gate material disposed on each of the at least one first semiconductor slab in the first channel region;

a first gate cut extending through the first gate adjacent to the first channel region of the at least one first semiconductor slab in the second direction;

at least one second semiconductor slab, each comprising:

a second type dopant;

a second channel region configured to conduct a second current in the first direction;

a third source/drain region on a first side of the second channel region; and a fourth source/drain region on a second side of the second channel region;

a second gate extending in the second direction and comprising the gate material disposed on each of the at least one second semiconductor slab in the second channel region; and a second gate cut extending through the second gate adjacent to the second channel region of the at least one second semiconductor slab in the second direction, wherein:

the first gate cut is configured to cause the first gate to exert a first force in the second direction and a second force in a third direction orthogonal to the second direction on the first channel region of the at least one first semiconductor slab; and the second gate cut is configured to cause the second gate to exert a third force in the second direction and a fourth force in the third direction on the second channel region of the at least one second semiconductor slab.

26 The CMOS circuit structure of clause 25, wherein:

the at least one first semiconductor slab comprises a first fin and a second fin doped with the first type dopant and separated from each other in the second direction; and the at least one second semiconductor slab comprises a third fin and a fourth fin doped with the second type dopant different than the first type dopant, the third fin and the fourth fin separated from each other in the second direction;

wherein:

the first gate cut comprises a first gate cut wall disposed between the first fin and the second fin and the second gate cut comprises a second gate cut wall disposed between the third fin and the fourth fin;

the first gate cut wall comprises a first gate cut material;

the second gate cut wall comprises a second gate cut material; and the first gate cut material is different than the second gate cut material.

27. The CMOS circuit structure of clause 26, further comprising:

a substrate; and an insulation layer disposed between the first gate and the substrate and between the second gate and the substrate in the third direction;

wherein:

the first gate cut further comprises a first gate cut wedge disposed in the insulation layer between the first gate cut wall and the substrate;

the second gate cut further comprises a second gate cut wedge disposed in the insulation layer between the second gate cut wall and the substrate; and the first gate cut wedge and the second gate cut wedge comprise the first gate cut material.

28. The CMOS circuit structure of clause 25, wherein:

the at least one first semiconductor slab comprises a first nanosheet stack and a second nanosheet stack separated from each other in the second direction;

and the at least one second semiconductor slab comprises a third nanosheet stack and a fourth nanosheet stack separated from each other in the second direction;

wherein:

the first gate cut comprises a first gate cut wall disposed between the first nanosheet stack and the second nanosheet stack and the second gate cut comprises a second gate cut wall disposed between the third nanosheet stack and the fourth nanosheet stack;

the first gate cut wall comprises a first gate cut material;

the second gate cut wall comprises a second gate cut material; and the first gate cut material is the same as the second gate cut material.

29. The CMOS circuit structure of clause 28, further comprising:

a substrate; and an insulation layer disposed between the first gate and the substrate and between the second gate and the substrate in the third direction;

wherein:

the first gate cut further comprises a first gate cut wedge disposed in the insulation layer between the first gate cut wall and the substrate;

the second gate cut further comprises a second gate cut wedge disposed in the insulation layer between the second gate cut wall and the substrate;

the first gate cut wedge comprises the first gate cut material;

the second gate cut wedge comprises a third gate cut material; and the first gate cut material is different than the third gate cut material.

30. The CMOS circuit structure of clause 28, further comprising:

a substrate; and an insulation layer disposed between the first gate and the substrate and between the second gate and the substrate in the third direction;

wherein:

the first gate cut further comprises a first gate cut wedge disposed in the insulation layer between the first gate cut wall and the substrate;

the second gate cut further comprises a second gate cut wedge disposed in the insulation layer between the second gate cut wall and the substrate;

the first gate cut wedge and the comprises the first gate cut material; and the second gate cut wedge comprises the second gate cut material.

What is claimed is:

1. A three-dimensional (3D) field-effect transistor (FET) structure, comprising:

at least one semiconductor slab, each comprising a channel region configured to conduct a current in a first direction;

an insulation layer;

a gate extending in a second direction orthogonal to the first direction, the gate comprising a gate material disposed on the insulation layer and on the at least one semiconductor slab in the channel region; and a gate cut extending through the gate material adjacent to the channel region of the at least one semiconductor slab in the second direction and extending into the insulation layer in a third direction orthogonal to the first direction and the second direction;

wherein:

the gate cut comprises a gate cut wedge disposed in the insulation layer, the gate cut wedge configured to cause the insulation layer to exert a first force on the channel region of the at least one semiconductor slab in the third direction.

2. The 3D FET structure of claim 1, wherein the gate cut comprises a gate cut wall configured to cause the gate to exert a second force in the second direction.

3. The 3D FET structure of claim 2, wherein:

the gate cut wedge comprises a first surface extending in the second direction and the third direction; and the insulation layer is disposed between the first surface and the channel region of the at least one semiconductor slab in the third direction.

4. The 3D FET structure of claim 2, wherein the gate cut wall comprises a first gate cut material configured to cause the second force comprising a compressive force.

5. The 3D FET structure of claim 4, wherein the gate cut wedge comprises a second gate cut material configured to cause the first force comprising a compressive force.

6. The 3D FET structure of claim 5, wherein:

the gate cut wall comprises silicon nitride (SiN); and the gate cut wedge comprises SiN.

7. The 3D FET structure of claim 4, wherein the gate cut wedge comprises a second gate cut material configured to cause the first force comprising a tensile force.

8. The 3D FET structure of claim 7, wherein:

the gate cut wall comprises silicon nitride (SiN); and the gate cut wedge comprises silicon dioxide ($SiO_2$).

9. The 3D FET structure of claim 2, wherein the gate cut wall comprises a first gate cut material configured to cause the second force comprising a tensile force.

10. The 3D FET structure of claim 9, wherein the gate cut wedge comprises a second gate cut material configured to cause the first force comprising a tensile force.

11. The 3D FET structure of claim 10, wherein:

the gate cut wall comprises silicon dioxide ($SiO_2$); and the gate cut wedge comprises $SiO_2$.

12. The 3D FET structure of claim 9, wherein the gate cut wedge comprises a second gate cut material configured to cause the first force comprising a compressive force.

13. The 3D FET structure of claim 12, wherein:

the gate cut wall comprises silicon dioxide ($SiO_2$); and the gate cut wedge comprises silicon nitride (SiN).

14. The 3D FET structure of claim 3, further comprising:

a substrate;

wherein the gate cut wedge is disposed in the insulation layer between the gate cut wall and the substrate.

15. The 3D FET structure of claim 14, wherein:

the first surface of the gate cut wedge is configured to exert a third force in the second direction.

16. The 3D FET structure of claim 15, wherein the first surface is in contact with the insulation layer between the gate and the substrate.

17. The 3D FET structure of claim 1, wherein the gate material is disposed between the gate cut and the at least one semiconductor slab.

18. The 3D FET structure of claim 1, wherein:

the 3D FET structure comprises a fin-type field effect transistor (FinFET); and the at least one semiconductor slab comprises at least one fin.

19. The 3D FET structure of claim 1, wherein:

the 3D FET structure comprises a gate-all-around (GAA) field effect transistor (FET); and the at least one semiconductor slab comprises at least one nanosheet.

20. The 3D FET structure of claim 1 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

21. A method of fabricating a three-dimensional (3D) field-effect transistor (FET) structure, the method comprising:

forming at least one semiconductor slab, each comprising a channel region configured to conduct a current in a first direction;

forming an insulation layer;

forming a gate extending in a second direction orthogonal to the first direction, the gate comprising a gate material disposed on the insulation layer and on the at least one semiconductor slab in the channel region; and forming a gate cut extending through the gate material adjacent to the channel region of the at least one semiconductor slab in the second direction and extending into the insulation layer in a third direction orthogonal to the first direction and the second direction;

wherein:

the gate cut comprises a gate cut wedge disposed in the insulation layer, the gate cut wedge configured to cause the insulation layer to exert a first force on the channel region of the at least one semiconductor slab in the third direction.

22. The method of claim 21, wherein:

forming the at least one semiconductor slab further comprises:

forming a first semiconductor slab on a substrate; and disposing the insulation layer on the substrate; and forming the gate further comprises forming the gate on the insulation layer.

23. The method of claim 22, further comprising:

forming a slice through the gate and into the insulation layer adjacent to the channel region of the at least one semiconductor slab;

forming a void in the insulation layer wider in the second direction than the slice; and forming the gate cut in the void and in the slice.

24. The method of claim 23, wherein:

forming the slice further comprises forming the slice extending along a plane orthogonal to the second direction; and forming the gate cut in the void and in the slice further comprises:

forming the gate cut wedge comprising a first surface of a first gate cut material, the first surface extending in the second direction and the third direction in the void; and forming a gate cut wall comprising a second gate cut material in the slice on the gate cut wedge.

25. A complementary metal-oxide semiconductor (CMOS) circuit structure comprising:

at least one first semiconductor slab, each comprising:

a first type dopant;

a first channel region configured to conduct a first current in a first direction;

a first source/drain region on a first side of the first channel region; and a second source/drain region on a second side of the first channel region;

an insulation layer;

a first gate extending in a second direction orthogonal to the first direction, the first gate comprising a gate material disposed on the insulation layer and on each of the at least one first semiconductor slab in the first channel region;

a first gate cut extending through the first gate adjacent to the first channel region of the at least one first semiconductor slab in the second direction and extending into the insulation layer in a third direction orthogonal to the first direction and the second direction;

at least one second semiconductor slab, each comprising:

a second type dopant;

a second channel region configured to conduct a second current in the first direction;

a third source/drain region on a first side of the second channel region; and a fourth source/drain region on a second side of the second channel region;

a second gate extending in the second direction and comprising the gate material disposed on each of the at least one second semiconductor slab in the second channel region; and a second gate cut extending through the second gate adjacent to the second channel region of the at least one second semiconductor slab in the second direction, wherein:

the first gate cut is configured to cause the first gate to exert a first force in the second direction and a second force in the third direction on the first channel region of the at least one first semiconductor slab;

the second gate cut is configured to cause the second gate to exert a third force in the second direction and a fourth force in the third direction on the second channel region of the at least one second semiconductor slab; and the first gate cut comprises a first gate cut wedge disposed in the insulation layer, the first gate cut wedge configured to cause the insulation layer to exert the second force on the first channel region in the third direction.

26. The CMOS circuit structure of claim 25, wherein:

the at least one first semiconductor slab comprises a first fin and a second fin doped with the first type dopant and separated from each other in the second direction; and the at least one second semiconductor slab comprises a third fin and a fourth fin doped with the second type dopant different than the first type dopant, the third fin and the fourth fin separated from each other in the second direction;

wherein:

a first gate cut wall is disposed between the first fin and the second fin and the second gate cut comprises a second gate cut wall disposed between the third fin and the fourth fin;

the first gate cut wall comprises a first gate cut material;

the second gate cut wall comprises a second gate cut material; and the first gate cut material is different than the second gate cut material.

27. The CMOS circuit structure of claim 26, further comprising:

a substrate, wherein:

the first gate cut further comprises a first gate cut wedge is disposed in the insulation layer between the first gate cut wall and the substrate;

the first gate cut wedge comprises a first surface extending in the second direction and in the third direction;

the insulation layer is disposed between the first surface and the first channel region;

the second gate cut further comprises a second gate cut wedge disposed in the insulation layer between the second gate cut wall and the substrate; and the first gate cut wedge and the second gate cut wedge comprise the first gate cut material.

28. The CMOS circuit structure of claim 25, wherein:

the at least one first semiconductor slab comprises a first nanosheet stack and a second nanosheet stack separated from each other in the second direction; and the at least one second semiconductor slab comprises a third nanosheet stack and a fourth nanosheet stack separated from each other in the second direction;

wherein:

a first gate cut wall is disposed between the first nanosheet stack and the second nanosheet stack and the second gate cut comprises a second gate cut wall disposed between the third nanosheet stack and the fourth nanosheet stack;

the first gate cut wall comprises a first gate cut material;

the second gate cut wall comprises a second gate cut material; and the first gate cut material is the same as the second gate cut material.

29. The CMOS circuit structure of claim 28, further comprising:

a substrate, wherein:

the insulation layer is disposed between the second gate and the substrate in the third direction;

the first gate cut wedge is disposed in the insulation layer between the first gate cut wall and the substrate;

the second gate cut further comprises a second gate cut wedge disposed in the insulation layer between the second gate cut wall and the substrate;

the first gate cut wedge comprises the first gate cut material;

the second gate cut wedge comprises a third gate cut material; and the first gate cut material is different than the third gate cut material.

30. The CMOS circuit structure of claim 28, further comprising:

a substrate, wherein:

the insulation layer is disposed between the second gate and the substrate in the third direction;

the first gate cut wedge is disposed in the insulation layer between the first gate cut wall and the substrate;

the second gate cut further comprises a second gate cut wedge disposed in the insulation layer between the second gate cut wall and the substrate;

the first gate cut wedge and the comprises the first gate cut material; and the second gate cut wedge comprises the second gate cut material.

* * * * *